United States Patent
Yamashita et al.

(10) Patent No.: US 6,545,934 B2
(45) Date of Patent: Apr. 8, 2003

(54) SEMICONDUCTOR MEMORY DEVICE HAVING CONFIGURATION SUITED FOR HIGH INTEGRATION

(75) Inventors: Takekazu Yamashita, Nagasaki (JP); Michio Nakajima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/840,175

(22) Filed: Apr. 24, 2001

(65) Prior Publication Data

US 2002/0034116 A1 Mar. 21, 2002

(30) Foreign Application Priority Data

Sep. 18, 2000 (JP) .................................. 2000-281390 (P)

(51) Int. Cl.[7] .................................................. G11C 8/00
(52) U.S. Cl. .............................. 365/230.03; 365/230.06
(58) Field of Search ....................... 365/230.03, 230.06, 365/230.08, 233, 51, 63, 231

(56) References Cited

U.S. PATENT DOCUMENTS

| | | | |
|---|---|---|---|
| 5,448,516 A | | 9/1995 | Tsukikawa et al. |
| 5,870,347 A | * | 2/1999 | Keeth et al. ........... 365/230.05 |
| 5,930,189 A | * | 7/1999 | Matsubara ................. 365/205 |
| 6,310,815 B1 | * | 10/2001 | Yamagata et al. ..... 365/230.03 |

FOREIGN PATENT DOCUMENTS

JP  3-19188  1/1991

* cited by examiner

Primary Examiner—Michael S. Lebentritt
Assistant Examiner—Anh Phung
(74) Attorney, Agent, or Firm—Burns, Doane, Swecker & Mathis, LLP

(57) ABSTRACT

A semiconductor memory device includes a plurality of regions. Each region includes memory cell arrays, an input/output circuit zone, column decoders, and a row decoder. The input/output circuit zone is placed between the memory cell arrays. The input/output circuit zone inputs or outputs data to or from the memory cell arrays selectively. As a result, high integration is realized with ease.

10 Claims, 16 Drawing Sheets

SEMICONDUCTOR MEMORY DEVICE HAVING CONFIGURATION SUITED FOR HIGH INTEGRATION

BACKGROUND OF THE INVENTION

1. Field of the Invention

The present invention relates to a semiconductor memory device and particularly, to a semiconductor memory device having a configuration suited for high integration.

2. Description of the Background Art

Referring to FIG. 13, a prior art semiconductor memory device 700 includes regions 710, 720, 721 to 724, 730 and 740. The region 710 includes a memory cell array 711, a column decoder 712, a row decoder 713 and an input/output circuit zone 714.

The memory cell array 711 includes a plurality of memory cell blocks 716 and a plurality of sense amplifier groups 717. The memory cell blocks 716 and the sense amplifier groups 717 are arranged alternately in a column direction 725. A memory cell block 716 includes a plurality of memory cells arranged in column and row directions 725 and 726. A sense amplifier group 717 amplifies data outputted from a plurality of memory cells included in the memory cell block 716.

The column decoder 712 decodes a column address based on an address signal inputted from an address terminal (not shown) to select each of a plurality of bit line pairs (not shown) included in the memory cell array 711 according to the decoded column address. The row decoder 713 decodes a row address based on an address signal inputted from the address terminal to select each of a plurality of word lines (not shown) included in the memory cell array 711 according to the decoded row address.

The input/output circuit zone 714 includes a main amplifier 7141, a write driver 7142 and an output driver 7143. The main amplifier 7141 amplifies data outputted from a plurality of memory cells included in the memory cell array 711 to output the amplified data to the output driver 7143. The write driver 7142 writes data inputted from the input/output terminal (not shown) onto a plurality of memory cells included in the memory cell array 711. The output driver 7143 outputs data amplified by the main amplifier 7141 to the input/output terminal (not shown).

The regions 720, 730 and 740 are of the same configuration as the region 710. The regions 721 to 724 includes respective peripheral circuit groups each constituted of a control circuit, a set-up circuit, a step-down circuit, a redundancy circuit and others.

In the semiconductor memory device 700, each of the regions 710, 720, 730 and 740 includes one input/output circuit zone 714 at one end thereof.

The semiconductor memory device 700 is fabricated, for example, as a semiconductor memory device of a 2 bank configuration. In that case, the memory cell arrays 711 of the respective regions 710 and 720 constitutes a bank A, and the memory cell arrays 711 of the regions 730 and 740 constitute a bank B. Furthermore, the semiconductor memory device 700 is fabricated as a semiconductor memory device of 4 bank configuration. In that case, the memory cell array 711 of the region 710 constitutes a bank A, and the memory cell array 711 of the region 720 a bank B, the memory cell array 711 of the region 730 a bank C and the memory cell array 711 of the region 740 a bank D.

Hence, the prior art semiconductor memory device 700 includes a plurality of banks and is of a configuration including one input/output circuit zone provided in each bank.

FIG. 14 a circuit diagram representing part of the region 710 shown in FIG. 13. Sense amplifier groups 717A, 717B, 717C, 717D and 717E and memory cell blocks 716A, 716B, 716C and 716D are arranged alternately in the column direction.

Word line drivers 718A, 718B, 718C and 718D are placed adjacent to the respective memory cell blocks 716A, 716B, 716C and 716D. Besides, the word line drivers 718A, 718B, 718C and 718D activate word lines placed in the respective memory cell blocks 716A, 716B, 716C and 716D according to an row address from the row decoder 713. When each of the memory cell blocks 716A, 716B, 716C and 716D includes 8 word lines. The word line drivers 718A, 718B, 718C and 718D are each inputted with a 4 bit row address from the row decoder 713. The highest one bit of a 4 bit row address selects each of the memory cell blocks 716A, 716B, 716C and 716D and the lower three bits further selects 8 word lines in each of the memory cell blocks 716A, 716B, 716C and 716D which have been selected by the highest one bit.

The memory cell blocks 716A, 716B, 716C and 716D each include a plurality of memory cells M/C arranged in the row and column directions.

The memory cell blocks 716A, 716B, 716C and 716D are connected to the input/output circuit zone 714 through global input/output line pairs GIOA, GIOB, GIOC and GIOD.

When a plurality of memory cells M/C, M/C, ... included in a group 716A1 of the memory cell block 716A are sequentially specified by the column decoder 712, the row decoder 713 and the word line driver 718A, a sense amplifier 717A1 amplifies data read out from each cell. Furthermore, the sense amplifier 717A1 outputs the amplified data to the input/output circuit zone 714 through the global input/output line pair GIOC. Moreover, a plurality of memory cells M/C, M/C, ... included in a group 716A4 of the memory cell block 716A, likewise, are sequentially specified, a sense amplifier 717A2 amplifies data read out from each memory cell. Then, the sense amplifier 717A2 outputs the amplified data to the input/output circuit zone 714 through the global input/output line pair GIOD. Furthermore, the sense amplifiers 717A1 and 717A2 amplify data outputted from not only a plurality of memory cells included in the memory cell block 716A, but also a plurality of memory cells included in a memory cell block (not shown) residing in the opposed side from the memory cell block 716A, and output the amplified data to the input/output circuit zone 714 through the global input/output line pairs GIOC and GIOD.

Furthermore, when a plurality of memory cells M/C, M/C, ... included in a group 716A2 of the memory cell block 716A are sequentially specified, a sense amplifier 717B1 amplifies data read out from each memory cell. Then the sense amplifier 717B1 outputs the amplified data to the input/output circuit zone 714 through the global input/output line pair GIOB. Besides, the sense amplifier 717B1 also amplifies data output from a plurality of memory cells M/C, M/C, ... included in a group 716B2 of the memory cell block 716B and outputs the amplified data onto the global input/output line pair GIOB.

Furthermore, when a plurality of memory cells M/C, M/C, ... included in a group 716A3 of the memory cell block 716A are sequentially specified, a sense amplifier 717B2 amplifies data read out from each memory cell. Then the sense amplifier 717B2 outputs the amplified data to the input/output circuit zone 714 through the global input/output line pair GIOA. Besides, the sense amplifier 717B2 also amplifies data output from a plurality of memory cells M/C, M/C, . . . included in a group 716B3 of the memory cell block 716B and outputs the amplified data onto the global input/output line pair GIOA.

Accordingly, data read out from a plurality of memory cells included in the memory cell block 716A are amplified by the sense amplifier group 717A or 717B and the amplified data are outputted to the input/output circuit zone 714 through the global input/output line pairs GIOA, GIOB, GIOC and GIOD.

This applies to a plurality of memory cells included in each of the other memory cell blocks 716B, 716C and 717D in a similar way.

Referring to FIG. 15, detailed description will be given of input/output of data to a memory cell. FIG. 15 shows a case where data is inputted/outputted with 4 bit as a unit. The group 716A1 of the memory block 716A includes a plurality of memory cells. The plurality of memory cells are connected to word lines WL00 to WL0n extending in the row direction and to bit line pair BL1 and /BL1 extending in the column direction. An N channel MOS transistor 731 is inserted in the bit line /BL1 and the N channel MOS transistor 732 is inserted in the bit line BL1. The N channel MOS transistors 731 and 732 are turned on/off by a control signal BLU0.

The sense amplifier 717A1 is connected between the bit line pair BL1 and /BL1. The bit line BL1 is connected to a local input/output line LIO00 through an N channel MOS transistor 734. The bit line /BL1 is connected to a local input/output line /LIO00 through an N channel MOS transistor 733. The N channel MOS transistors 733 and 734 are turned on/off in company with activation/deactivation of a column select line CSL0 connected to the column decoder 712.

The local input/output line LIO00 is connected to the global input/output line GIO1 through an N channel MOS transistor 735 and the local input/output line /LIO00 is connected to the global input/output line /GIO01 through an N channel MOS transistor 736. The N channel MOS transistors 735 and 736 are turned on/off by a control signal LIS00. Note that the N channel MOS transistors 735 and 736 constitutes a switch 719A connecting the local input/output line pair and the global input/output line pair therebetween.

The global input/output line pair GIO1 and /GIO1 are connected to the main amplifier 7141 and the write driver 7142. Besides, the output driver 7143 is connected to the main amplifier 7141.

The write driver 7142 is composed of inverters 737 to 740 P channel MOS transistors 741 and 743; and N channel MOS transistors 742 and 744. The P channel MOS transistor 741 and the N channel MOS transistor 742 are connected in series between a power source node and a ground node. Furthermore, the P channel MOS transistor 743 and the N channel MOS transistor 744 are connected in series between the power source node and the ground node.

The output driver 7143 is composed of a P channel MOS transistor 745; and an N channel MOS transistor 746. The P channel MOS transistor 745 and the N channel MOS transistor 746 are connected in series between the power source node and the ground node.

The main amplifier 7141 amplifies a potential difference between the global input/output line pair GIO1 and /GIO1 and outputs a resultant to the output driver 7143. The output driver 7143 outputs a signal of H (logical high) level or L (logical low) to an output pin DQ1 based on the potential difference outputted from the main amplifier 7141. When data is inputted to an input pin DIN1, the write driver 7142 provides a potential difference based on input data between the global input/output line pair GIO1 and /GIO1. When data [1] is inputted to the input pin DIN1, the inverter 737 outputs a signal of L level and the inverter 738 outputs a signal of H level. Furthermore, the inverter 739 outputs a signal of L level and the inverter 740 outputs a signal of H level.

As a result, the N channel MOS transistor 742 and the P channel MOS transistor 743 are turned off, while the P channel MOS transistor 741 and the N channel MOS transistor 744 are turned on. The write driver 7142 outputs a signal of H level onto the global input/output line GIO1 and a signal of L level onto the global input/output line /GIO1.

When data [0] is inputted to the input pin DIN1, the inverter 737 outputs a signal of H level and the inverter 738 outputs a signal of L level. Furthermore, the inverter 739 outputs a signal of H level and the inverter 740 outputs a signal of L level.

As a result, the P channel MOS transistor 741 and the N channel MOS transistor 744 are turned off, while the N channel MOS transistor 742 and the P channel MOS transistor 743 are turned on. The write driver 7142 outputs a signal of L level onto the global input/output line GIO1 and a signal of H level onto the global input/output line /GIO1.

Description will be given of reading out data from a plurality of memory cells included in the group 716A1 of the memory cell block 716A. The column select line CSL0 is activated by the column decoder 712. The word line driver 718A activates each of the word lines WL00 to WL0n according to a row address decoded by the row decoder 713. Furthermore, the N channel MOS transistors 731 and 732 are turned on by the control signal BLU0 from the control circuit (not shown) and the N channel MOS transistors 735 and 736 are turned on by the control signal LIS00 from the control circuit.

When the word line WL00 is activated and data [1] is outputted from a memory cell, the bit line /BL1 assumes a potential $VCC/2+\alpha$ slightly higher than a precharge potential $VCC/2$, while the bit line BL1 remains at the precharge potential $VCC/2$. The potential $VCC/2+\alpha$ on the bit line /BL1 is transmitted to the sense amplifier 717A1 through the N channel MOS transistor 733 and the potential $VCC/2$ on the bit line BL1 is transmitted to the sense amplifier 717A1 through the N channel MOS transistor 732. Then, the sense amplifier 717A1 raises the potential $VCC/2+\alpha$ on the bit line /BL1 to the power source potential VCC and lowers the potential $VCC/2$ on the bit line BL1 down almost to 0V. That is, the sense amplifier 717A1 amplifies a potential difference between the bit lines BL1 and /BL1. Then, the potential VCC on the bit line /BL1 is transmitted onto the local input/output line /LIO00 through the N channel MOS transistor 733 and the potential 0V on the bit line BL1 is transmitted to the local input/output LIO00 through the N channel MOS transistor 734.

The local input/output line /LIO00 outputs a potential $VCC-(Vthn+\alpha)$ onto the global input/output line /GIO1 through the N channel MOS transistor 736 and the local input/output line LIO00 outputs a potential 0V onto the global input/output line GIO1 through the N channel MOS transistor 735. Then, the main amplifier 7141 further amplifies a potential difference between the global input/output line pair GIO1 and /GIO1 and outputs the potential 0V to the gate terminal of the P channel MOS transistor 745 and the potential $VCC-(Vthn+\alpha)$ to the gate terminal of the N channel MOS transistor 746. Then, the P channel MOS transistor 745 and the N channel MOS transistor 746 are turned on, and the output driver 7143 outputs a signal of H level, that is data [1], to the output pin DQ1.

When data [0] is outputted from a memory cell connected to the word line WL00, potentials on the bit line pair BL1 and /BL1, the local input/output line pair LIO00 and /LIO00 and the global input/output line pair GIO0 and /GIO0 assume inverted potentials to the respective above described potentials and the inverted potentials are inputted to the main amplifier 7141. Then, the main amplifier 7141 outputs a potential VCC−(Vthn+α) to the gate terminal of the P channel MOS transistor 745 and provides the potential 0V to the gate terminal of the N channel MOS transistor 746. Then, the output driver 7143 outputs a signal of L level, that is data [0], to the output pin DQ1.

Description will be given of writing data onto a plurality of memory cells included in the group 716A1 of the memory cell array 716A. When data [1] is inputted to the input pin DIN1, the write driver 7142, as described above, raises a potential on the global input/output line /GIO0 to the potential VCC while lowering a potential on the global input/output line GIO1 down to the potential 0V. The global input/output line /GIO1 inputs the potential VCC onto the local input/output line /LIO00 through the N channel MOS transistor 736 and the global input/output line GIO1 inputs the potential 0V onto the local input/output line LIO00 through the N channel MOS transistor 735. Then, the local input/output line /LIO00 inputs the potential VCC onto the bit line /BL1 through the N channel MOS transistor 733 and the local input/output line LIO00 inputs the potential 0V onto the bit line BL1 through the N channel MOS transistor 734.

The potential VCC on the bit line /BL1 is transmitted along the bit line /BL1 through the N channel MOS transistor 731 and written onto a memory cell activated by the word line WL00.

When data [0] is inputted to the input pin DIN1, potentials on the global input/output lime pair GIO1 and /GIO1, the local input/output line pair LIO00 and /LIO00 and the bit line pair BL1 and /BL1 assume inverted potentials to the respective above described potentials. Then, the data [0] is written onto a memory cell activated by the word line WL00.

Likewise, data outputted from each of a plurality of memory cells included in the group 716A2 of the memory cell block 716 is amplified by the sense amplifier 717B1 and the amplified data is outputted to the main amplifier and the output driver through a local input/output line pair LIO101 and /LIO01, a switch 719B and a global input/output line pair GIO2 and /GIO2. Besides, following a reverse route of the above described, data is written onto each of a plurality of memory cells included in the group 716A2 of the memory cell block 716A.

Furthermore, data outputted from each of a plurality of memory cells included in the group of 716A3 is amplified by the sense amplifier 717B2 and the amplified data is outputted to the main amplifier and the output driver through the local input/output line pair LIO01 and /LIO01, the switch 719B and the global input/output line pair GIO2 and /GIO2. Besides, following a reverse route of the above described, data is written onto each of a plurality of memory cells included in the group 716A3.

Furthermore, data outputted from each of a plurality of memory cells included in the group 716A4 is amplified by the sense amplifier 717A2 and the amplified data is outputted to the main amplifier and the output driver through the local input/output line pair LIO00 and /LIO00, the switch 719A and the global input/output line pair GIO1 and /GIO1. Besides, following a reverse route of the above described, data is written onto each of a plurality of memory cells included in the group 716A4.

FIG. 16 is a circuit diagram in a case where data is inputted/outputted with 2 bits as a unit. In the same operation as described above, data is inputted or outputted to or from a plurality of memory cells included in each of the memory cell blocks 716A, 716B, 716C and 716D.

In the prior art semiconductor memory device 700, however, the regions 710, 720, 730 and 740 are provided with 4 input/output circuit zones 714; therefore, when data increases in number of bits in the future, an occupancy area of input/output circuit zones is totally larger, resulting in a problem to hinder increase in integration.

Furthermore, since the 4 input/output circuit zones are gathered almost in the central portion of the semiconductor memory device 700, power consumption is locally concentrated, resulting again in a problem to hinder stable operations of adjacent circuits.

Moreover, since in the prior semiconductor memory device 700, data is inputted or outputted to or from each of plurality of memory cells included in one bank by one input/output circuit zone, power consumption in the input/output circuit zone increases, resulting still again in a problem to hinder reduction in power consumption.

SUMMARY OF THE INVENTION

It is accordingly an object of the present invention to provide a semiconductor memory device easy to achieve its high integration.

It is another object of the present invention to provide a semiconductor memory device capable of distributing power consumption across the device.

It is still another object of the present invention to provide a semiconductor memory device capable of realizing low power consumption even in its highly integrated state.

The present invention is directed to a semiconductor memory device having a plurality of regions, each of which includes first and second memory cell arrays arranged in a column direction, and an input/output circuit zone placed between the first and second memory cell arrays, wherein the input/output circuit zone inputs or outputs data to or from a plurality of memory cells included in each of the first and second memory cell arrays.

A semiconductor memory cell according to the present invention includes a plurality of regions obtained by division. Each of the plurality of regions includes first and second memory cell arrays and an input/output circuit zone placed between the first and second memory cell arrays. The input/output circuit zone inputs or outputs data to or from a plurality of memory cells included in the first memory cell array or the second memory cell array.

Hence, according to the present invention, since the input/output circuit zone inputting/outputting data is placed between the first and second regions in each of the plurality of regions obtained by division, the input/output circuit zones are distributed all over the semiconductor memory device. As a result, power consumption can be prevented from being locally concentrated. Furthermore, according to the present invention, the input/output circuit zone can be configured with a smaller number of circuits by inputting or outputting data to or from the first and second memory cell arrays in a selective manner. As a result, an occupancy area of the input/output circuit zone can be smaller.

In each of a plurality of regions of a semiconductor memory device, one bank is preferably constituted of the first and second memory cell arrays.

One bank is divided into first and second memory cell arrays and an input/output circuit zone is placed between the first and second memory cell arrays. Hence, according to the present invention, input/output circuit zones can be distributed in placement on a semiconductor memory device in which data is inputted to or outputted from each bank as a unit.

Each of first and second memory cell arrays included in a plurality of regions of a semiconductor memory device preferably constitutes one bank different from the other.

An input/output circuit zone is placed between banks. The input/output circuit zone inputs or outputs data to or from a plurality of memory cells included in one bank or the other bank. Hence, according to the present invention, input/output circuit zones can be distributed in placement on a semiconductor memory device of a 2 bank configuration.

It is preferable that a plurality of regions in a semiconductor memory device constitute a semiconductor memory device of a 4 bank configuration and each of the first and second memory cell arrays constitutes one bank different from the other.

For example, in a semiconductor memory device constructed from a bank A, a bank B, a bank C and a bank D, input/output circuit zones are placed between the banks A and B, and between the banks C and D, respectively. Hence, according to the present invention, input/output circuit zones can be distributed in placement on a semiconductor memory device of a 4 bank configuration.

It is preferable that data of n bits (n is a natural number) is inputted or outputted to or from each of a plurality of regions of a semiconductor memory device and an input/output circuit zone includes n input/output circuits for inputting or outputting data of n bits to or from a plurality of memory cells included in a first or second memory cell array.

The input/output circuit zone selectively inputs or outputs data of n bits as a unit to or from the first or second memory cell array. Each of a plurality of regions inputs or outputs data of n bits as a unit. Hence, according to the present invention, the number of the input/output circuits constituting an input/output circuit zone can be smaller. As a result, an occupancy area of the input/output circuit zone can be smaller.

Each of a plurality of regions of a semiconductor memory device preferably further includes a plurality of first local input/output line pairs for inputting or outputting data to or from each of a plurality of memory cells included in a first memory cell array, a plurality of second local input/output line pairs for inputting or outputting data to or from each of a plurality of memory cells included in a second memory cell array, a plurality of common global input/output line pairs connected to an input/output circuit zone, a plurality of first global input/output line pairs connected to the plurality of first local input/output line pairs, a plurality of second global input/output line pairs connected to the plurality of second local input/output line pairs, a plurality of first switches for connecting the plurality of common global input/output line pairs to a corresponding plurality of first global input/output line pairs, and a plurality of second switches for connecting the plurality of common global input/output line pairs to a corresponding plurality of second global input/output line pairs.

Data is inputted to or outputted from a plurality of memory cells included in the first memory cell array through a first local input/output line pair, a first global input/output line pair, a first switch and a common global input/output line pair. Furthermore, data is inputted to or outputted from a plurality of memory cells included in the second memory cell array through a second local input/output line pair, a second global input/output line pair, a second switch and a common global input/output line pair. Hence, data can be selectively inputted to or outputted from the first or second memory cell array by selectively turning on or off the first or second switch.

A plurality of first switches and a plurality of second switches are preferably placed between the first and second memory cell arrays.

The first switches and the second switches are placed between the first and second memory cell arrays together with an input/output circuit zone. Hence, according to the present invention, since the input/output circuit zone and the switches are collectively placed in one area, a total occupancy area of the switches and the input/output circuit zone can be smaller.

Each of a plurality of regions of a semiconductor memory device preferably further includes a first column decoder selecting a plurality of bit line pairs connected to a plurality of memory cells included in a first memory cell array, and a second column decoder selecting a plurality of bit line pairs connected to a plurality of memory cells included in a second memory cell array, wherein each of a plurality of first switches is turned on/off by a control signal from the first column decoder and each of a plurality of second switches is turned on/off by a control signal from the second column decoder.

A plurality of memory cells included in the first memory cell array are selected by the first column decoder and a plurality of memory cells included in the second memory cell array are selected by the second column decoder. A first switch is turned on/off by a control signal from the first column decoder and a second switch is turned on/off by a control signal from the second column decoder.

Hence, according to the present invention, a first switch can be turned on in synchronism with input or output of data to or from the first memory cell array and a second switch can be turned on in synchronism with input or output of data to or from the second memory cell array.

It is preferable that in a test mode, a first switch connecting a first global input/output line pair for inputting or outputting data to or from one memory cell selected arbitrarily from the first memory cell array and a common global input/output line pair corresponding to the first global input/output line pair therebetween is turned on, and a second switch connecting a second global input/output line pair for inputting or outputting data to or from a memory cell having the same address as the one memory cell among a plurality of memory cells included in the second memory cell array and a common global input/output line pair corresponding to the second global input/output line pair therebetween is turned on.

In the test mode, data are inputted to or outputted from a plurality of memory cells included in the first memory cell array and a plurality of memory cells in the second memory cell array simultaneously. Hence, according to the present invention, a test time can be reduced.

Furthermore, a semiconductor memory device according to the present invention has a plurality of regions and each of the plurality of regions includes first and second memory cell arrays arranged in a column direction, a column decoder placed between the first and second memory cell arrays, a first input/output circuit zone inputting or outputting data to or from a plurality of memory cells included in the first memory cell array, and a second input/output circuit zone inputting or outputting data to or from a plurality of memory cells included in the second memory cell array.

A semiconductor memory device according to the present invention includes a plurality of regions. Each of the plurality of regions includes first and second memory cell arrays, a column decoder placed between the first and second memory cell arrays, and first and second input/output circuit zones. That is, two input/output circuit zones are placed in each region. Hence, according to the present invention, input/output circuit zones can be distributed in placement. As a result, power consumption can be prevented from locally being concentrated. Besides, malfunction of adjacent circuits due to the local concentration in power consumption can be prevented from occurring.

In each of a plurality of regions of a semiconductor memory device, one bank is preferably constituted of first and second memory cell arrays.

Two input/output circuit zones are provided in one bank. Hence, according to the present invention, input/output circuit zones can be distributed in placement on a semiconductor memory device inputting/outputting data with each bank as a unit. As a result, local concentration of power consumption can be prevented from occurring. Besides, malfunction of adjacent circuits due to local concentration of power consumption can be prevented from occurring.

Each of first and second memory cell arrays included in a plurality of regions of a semiconductor memory device preferably constitutes one bank different from the other.

A first input/output circuit zone inputs or outputs data to or from a plurality of memory cells included in one bank. A second input/output circuit zone inputs or outputs data to or from a plurality of memory cells included in the other bank. Hence, according to the present invention, a configuration can be realized which is suited for banks each inputting or outputting data to or from itself independently and simultaneously, in which distribution of input/output circuit zones in placement can be effected.

It is preferable that a plurality of regions in a semiconductor memory device constitute a semiconductor memory device of a 4 bank configuration and each of the first and second memory cell arrays constitutes one bank different from the other.

For example, in a semiconductor memory device of a 4 banks including a bank A, a bank B, a bank C and a bank D, one input/output circuit zone is provided to each of the banks A, B, C and D. Furthermore, each of the banks A, B, C and D performs supply and reception of data on an individual input/output circuit zone. Hence, according to the present invention, in a semiconductor memory device of a 4 bank configuration, distribution of input/output circuit zones in placement, suited for the bank configuration can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention with reference to the accompanying drawings. Note that the same or corresponding constituents are indicated by the same symbols and descriptions thereof are not repeated.

[First Embodiment]

Figure 1:
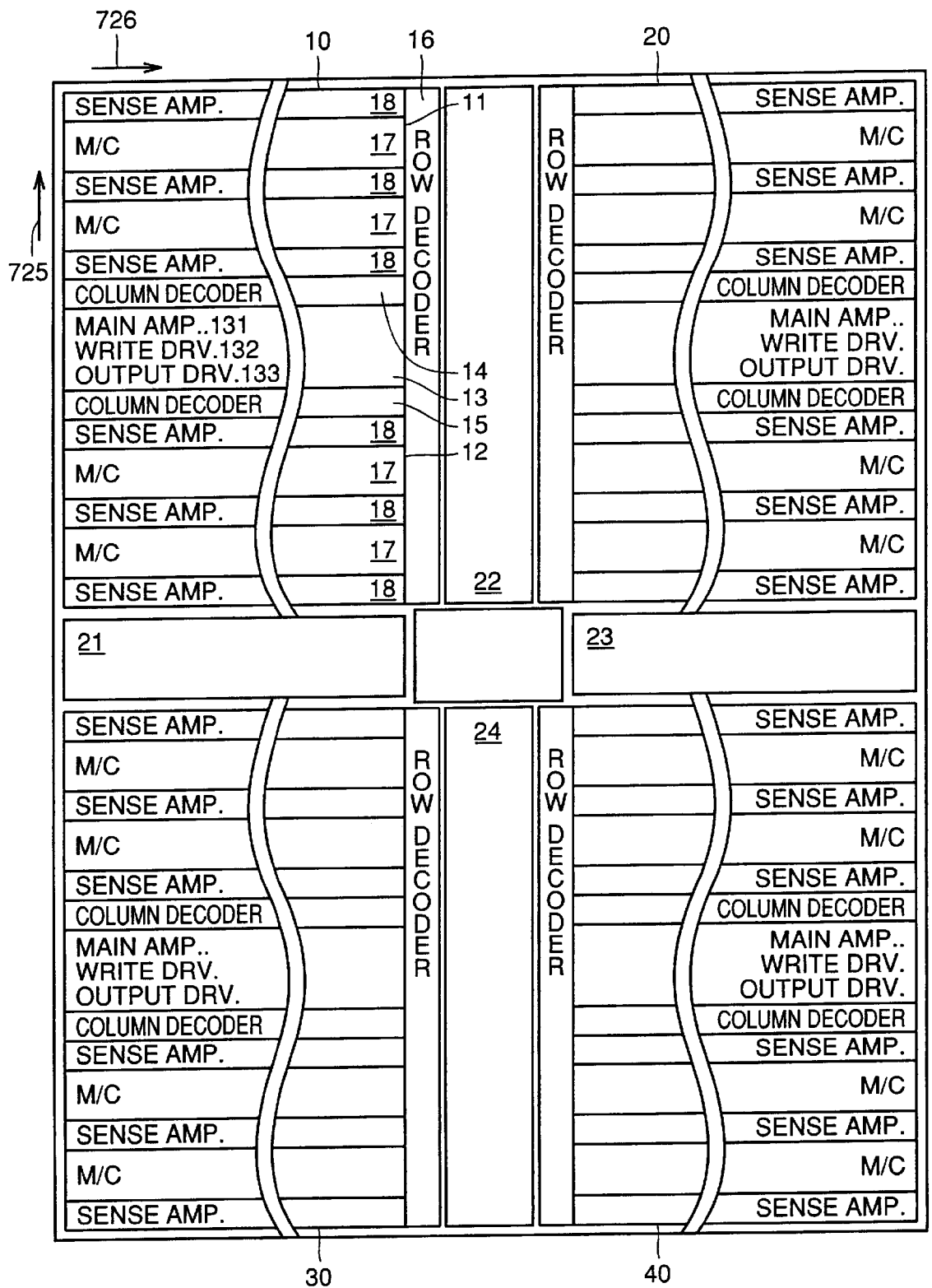
FIG. 1 is a schematic block diagram of a semiconductor memory device according to a first embodiment of the present invention.

Referring to FIG. 1, a semiconductor memory device 100 according to the first embodiment of the present invention includes regions 10, 20, 21 to 24, 30 and 40. The region 10 includes memory cell arrays 11 and 12, an input/output circuit zone 13, column decoders 14 and 15, and a row decoder 16.

Memory cell arrays 11 and 12 each are constructed from a plurality of memory cell blocks 17, and a plurality of sense amplifier groups 18. The memory cell blocks 17 and sense amplifier groups 18 are arranged alternately in a column direction. A memory cell block 17 includes a plurality of memory cells in an arrangement in a column direction 725 and a row direction 726. A sense amplifier group 18 amplifies data outputted from a plurality of memory cells included in a memory cell block 17.

The column decoder 14 decodes a column address based on an address signal inputted to an address terminal (not shown) and selects each of a plurality of bit line pairs (not shown) included in the memory cell array 11 according to the column address obtained by the decoding.

Furthermore, the column decoder 15 decodes a column address based on an address signal inputted to an address terminal (not shown) and selects each of a plurality of bit line pairs (not shown) included in the memory cell array 12 according to the column address obtained by the decoding.

The row decoder 16 decodes a row address based on an address signal inputted to an address terminal and selects each of a plurality of word lines (not shown) included in the memory cell arrays 11 and 12 according to the row address obtained by the decoding.

The input/output circuit zone 13 is placed between the memory cell arrays 11 and 12. The input/output circuit zone 13 includes a main amplifier 131, a write driver 132 and an output driver 133. The main amplifier 131 amplifies data outputted from a plurality of memory cells included in the memory cell arrays 11 and 12 and outputs the amplified data to the output driver 133. The write driver 132 writes data inputted from an input/output terminal (not shown) onto a plurality of memory cells included in the memory cell arrays 11 and 12. The output driver 133 outputs data amplified by the main amplifier 131 to the input/output terminal (not shown).

The regions 20, 30 and 40 are configured in the same way as the region 10. The regions 21 to 24 each include a peripheral circuit group composed of a control circuit, a step-up circuit, a step-down circuit, a redundancy circuit and others.

In the semiconductor memory device 100, the memory cell arrays 11 and 12 constitute one bank.

Hence, the semiconductor memory device 100 is configured such that in the device, each bank is divided into two regions and one input/output circuit zone is placed between the two regions.

Figure 2:
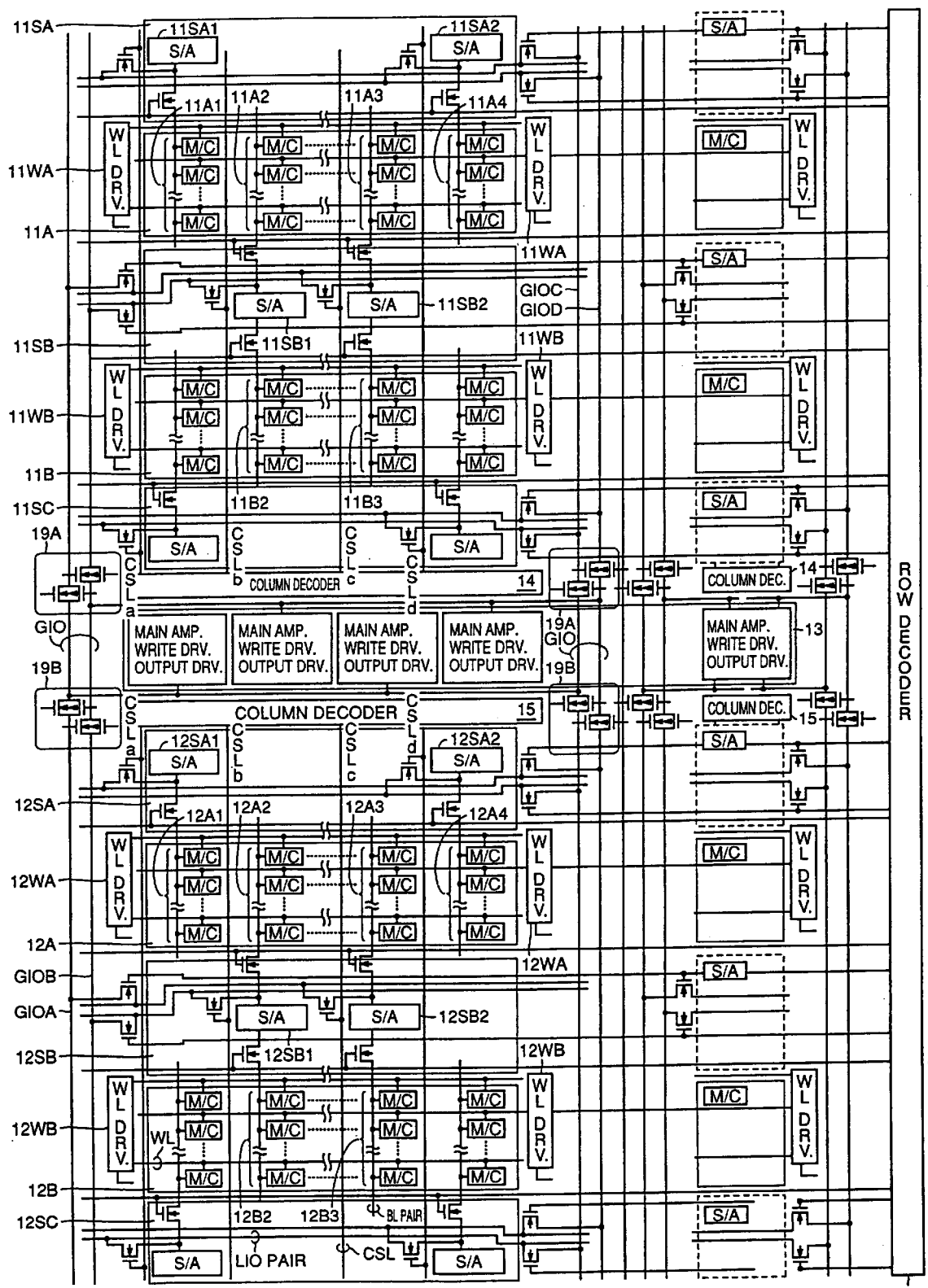
FIG. 2 is a circuit diagram representing part of the semiconductor memory device shown in FIG. 1.

FIG. 2 is a circuit diagram representing part of the region 10 shown in FIG. 1. Sense amplifier groups 11SA, 11SB and 11SC, and memory cell blocks 11A and 11B are arranged alternatively in the column direction in the memory cell array 11.

Moreover, sense amplifier groups 12SA, 12SB and 12SC, and memory cell blocks 12A, 12B and 12C are arranged alternatively in the column direction.

Word line drivers 11WA and 11WB are placed adjacent to the respective memory cell blocks 11A and 11B. The word line drivers 11WA and 11WB activate word lines arranged in the respective memory cell blocks 11A and 11B according to a row address from the row decoder 16.

Moreover, the word line drivers 12WA and 12WB are placed adjacent to respective memory cell blocks 12A and 12B. The word line drivers 12WA and 12WB activate word lines arranged in the respective memory cell blocks 12A and 12B according to a row address from the row decoder 16.

When each of the memory cell blocks 11A and 11B includes, for example, 8 word lines, the word line drivers 11WA and 11WB are inputted with a row address of 4 bits from the row decoder 16. The highest one bit of 4 bits of the row address selects each of the memory cell blocks 11A and 11B, while the lower 3 bits thereof select the 8 word lines in each of the memory cell blocks 11A and 11B which have been selected by the highest one bit. This applies to the word line drivers 12WA and 12WB in a similar way.

The memory cell blocks 11A, 11B, 12A and 12B each include a plurality of memory cells M/C arranged in the row and column directions.

The memory cell blocks 11A and 11B are connected to the input/output circuit zone 13 through global input/output line pairs GIOA, GIOB, GIOC and GIOD, a switch 19A and a common global input/output line pair GIO. Furthermore, the memory cell blocks 12A and 12B are connected to the input/output circuit zone 13 through the global input/output line pairs GIOA, GIOB, GIOC and GIOD, a switch 19B and the common global input/output line pair GIO.

The switches 19A and 19B connects the global input/output line pairs GIOA, GIOB, GIOC and GIOD to the common global input/output line pair GIO. The switch 19A is turned on/off by a control signal generated by the column decoder 14. The switch 19B is turned on/off by a control signal generated by the column decoder 15.

When data is inputted or outputted to or from a plurality of memory cells included in the memory cell blocks 11A and 11B, the switch 19A is turned on, while the switch 19B is turned off. Furthermore, when data is inputted or outputted to or from a plurality of memory cells included in the memory cell blocks 12A and 12B, the switch 19A is turned off, while the switch 19B is turned on. Hence, the input/output circuit zone 13 inputs or outputs data to or from a plurality of memory cells included in the memory cell array 11 or a plurality of memory cells included in the memory cell array 12 selectively.

When a plurality of memory cells M/C, M/C, . . . included in a group 11A1 of the memory cell block 11A are sequentially specified by the column decoder 14, the row decoder 16 and the word line driver 11WA, a sense amplifier 11SA1 amplifies data read out from each cell. Then, the sense amplifier 11SA1 outputs the amplified data to the input/output circuit zone 13 through the global input/output line pair GIOC, the switch 19A and the common global input/output line pair GIO. Moreover, likewise, when a plurality of memory cells M/C, M/C, . . . included in a group 11A4 of the memory cell block 11A are sequentially specified, a sense amplifier 11SA2 amplifies data read out from each cell. Then, the sense amplifier 11SA2 outputs the amplified data to the input/output circuit zone 13 through the global input/output line pair GIOD, the switch 19A and the common global input/output line pair GIO.

Furthermore, the sense amplifiers 11SA1 and 11SA2 also amplify data outputted from not only a plurality of memory cells included in the memory cell block 11A, but also a plurality of memory cells included in a memory cell block (not shown) in the opposite side from the memory cell block 11A, and output the amplified data to the input/output circuit zone 13 through the global input/output line pairs GIOC and GIOD, the switch 19A and the common global input/output line pair GIO.

Moreover, when a plurality of memory cells M/C, M/C, . . . included in a group 11A2 of the memory cell block 11A are sequentially specified, a sense amplifier 11SB1 amplifies data read out from each cell. Then, the sense amplifier 11SB1 outputs the amplified data to the input/output circuit zone 13 through the global input/output line pair GIOB, the switch 19A and the common global input/output line pair GIO. Moreover, the sense amplifier 11SB1 also amplifies data outputted from a plurality of memory cells M/C, M/C, . . . included in a group 11B2 of the memory cell block 11B, and outputs the amplified data to the input/output circuit zone 13 through the global input/output line pair GIOB, the switch 19A and the common global input/output line pair GIO.

Moreover, when a plurality of memory cells M/C, M/C, . . . included in a group 11A3 of the memory cell block 11A are sequentially specified, a sense amplifier 11SB2 amplifies data read out from each cell. Then, the sense amplifier 11SB2 outputs the amplified data to the input/output circuit zone 13 through the global input/output line pair GIOA, the switch 19A and the common global input/output line pair GIO. Moreover, the sense amplifier 11SB2 also amplifies data outputted from a plurality of memory cells M/C, M/C, . . . included in a group 11B3 of the memory cell block 11B, and outputs the amplified data to the input/output circuit zone 13 through the global input/output line pair GIOA, the switch 19A and the common global input/output line pair GIO.

When a plurality of memory cells M/C, M/C, . . . included in a group 12A1 of the memory cell block 12A are sequentially specified by the column decoder 15, the row decoder 16 and the word line driver 12WA, a sense amplifier 12SA1 amplifies data read out from each cell. Then, the sense amplifier 12SA1 outputs the amplified data to the input/output circuit zone 13 through the global input/output line pair GIOD, the switch 19B and the common global input/output line pair GIO. Moreover, likewise, when a plurality of memory cells M/C, M/C, . . . included in a group 12A4 of the memory cell block 12A are sequentially specified, a sense amplifier 12SA2 amplifies data read out from each cell. Then, the sense amplifier 12SA2 outputs the amplified data to the input/output circuit zone 13 through the global input/output line pair GIOC, the switch 19B and the common global input/output line pair GIO. Furthermore, the sense amplifiers 12SA1 and 12SA2 also amplify data outputted from not only a plurality of memory cells included in the memory cell block 12A, but also a plurality of memory cells included in a memory cell block (not shown) in the opposite side from the memory cell block 11A and output the amplified data to the input/output circuit zone 13 through the global input/output line pairs GIOC and GIOD, the switch 19B and the common global input/output line pair GIO.

Moreover, when a plurality of memory cells M/C, MIC, . . . included in a group 12A2 of the memory cell block 12A are sequentially specified, a sense amplifier 12SB1 amplifies data read out from each cell. Then, the sense amplifier 12SB1 outputs the amplified data to the input/output circuit zone 13 through the global input/output line pair GIOB, the switch 19B and the common global input/output line pair GIO. Moreover, the sense amplifier 12SB1 also amplifies data outputted from a plurality of memory cells M/C, M/C, . . . included in a group 12B2 of the memory cell block 12B and outputs the amplified data to the input/output circuit zone 13 through the global input/output line pair GIOB, the switch 19B and the common global input/output line pair GIO.

Moreover, when a plurality of memory cells M/C, M/C, . . . included in a group 12A3 of the memory cell block 12A are sequentially specified, a sense amplifier 12SB2 amplifies data read out from each cell. Then, the sense amplifier 12SB2 outputs the amplified data to the input/output circuit zone 13 through the global input/output line pair GIOA, the switch 19B and the common global input/output line pair GIO. Moreover, the sense amplifier 12SB2 also amplifies data outputted from a plurality of memory cells M/C, M/C, . . . included in a group 12B3 of the memory cell block 12B and outputs the amplified data to the input/output circuit zone 13 through the global input/output line pair GIOA, the switch 19B and the common global input/output line pair GIO.

Hence, data read out from a plurality of memory cells included in the memory cell block 11A is amplified by the sense amplifiers 11SA and 11SB residing on both sides thereof and the amplified data is outputted to the input/output circuit zone 13 through the global input/output line pairs GIOA, GIOB, GIOC and GIOD, the switch 19A, and the common global input/output line pair GIO. Furthermore, data read out from a plurality of memory cells included in the memory cell block 12A is amplified by the sense amplifier groups 12SA and 12SB and the amplified data is outputted to the input/output circuit zone 13 through the global input/output line pairs GIOA, GIOB, GIOC and GIOD, the switch 19B, and the common global input/output line pair GIO.

This applies to a plurality of memory cells included in the other memory cell blocks 11B and 12B in a similar way.

Figure 3:
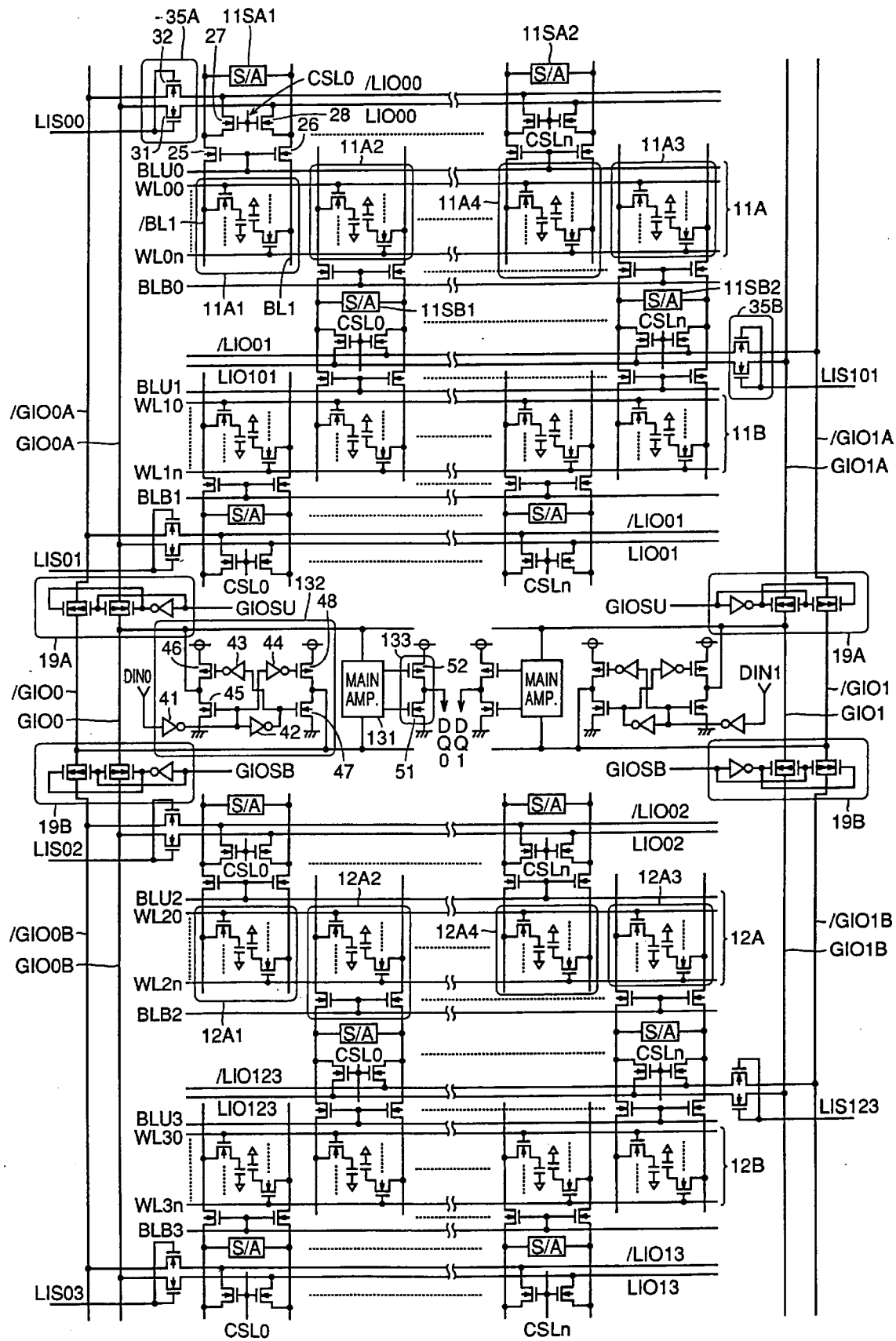
FIG. 3 is a circuit diagram representing part of the circuit diagram of FIG. 2.

Referring to FIG. 3, detailed description will be given of inputting or outputting data to or from a memory cell. The group 11A1 of the memory cell block 11A includes a plurality of memory cells. The plurality of memory cells are connected to word lines WL00 to WL0n extending in the row direction and bit line pairs BL1 and /BL1 extending in the column direction. An N channel MOS transistor 25 is inserted in the bit line /BL1 and an N channel MOS transistor 26 is inserted in the bit line BL1. The N channel MOS transistors 25 and 26 are turned on/off by a control signal BLU0.

The sense amplifier 11SA1 is connected between the bit line pair BL1 and /BL1. The bit line BL1 is connected to a local input/output line LIO00 through an N channel MOS transistor 28. The bit line /BL1 is connected to the local input/output line /LIO00 through an N channel MOS transistor 27. The N channel MOS transistors 27 and 28 are turned on/off in company with activation/deactivation of a column select line CSL0 connected to the column decoder 14.

The local input/output line LIO00 is connected to a global input/output line GIO0A through an N channel MOS transistor 31 and the local input/output line /LIO00 is connected to a global input/output line /GIOA through an N channel MOS transistor 32. The N channel MOS transistors 31 and 32 are turned on/off by a control signal LIS00. Note that the N channel MOS transistors 31 and 32 constitute a switch 35A connecting the local input/output line pair and the global input/output line pair therebetween.

The global input/output line pair GIO0A and /GIO0A is connected to the common global input/output line pair GIO0 and /GIO0 through the switch 19A. The common global input/output line pair GIO is connected to the main amplifier 131 and the write driver 132. The output driver 133 is connected to the main amplifier 131.

The write driver 132 includes inverters 41 to 44, N channel MOS transistors 45 and 47, and P channel MOS transistors 46 and 48. An N channel MOS transistor 745 and a P channel MOS transistor 746 are connected in series between the power source node and the ground node. The N channel MOS transistor 47 and the P channel MOS transistor 48 are connected in series between the power source node and the ground node.

The output driver 133 includes an N channel MOS transistor 51, and P channel MOS transistor 52. The N channel MOS transistor 51 and the P channel MOS transistor 52 are connected in series between the power source node and the ground node.

The main amplifier 131 amplifies a potential difference between the common global input/output pair GIO0 and /GIO0 and outputs a resultant to the output driver 133. The output driver 133 outputs a signal of H or L level to an output pin DQ0 based on the potential difference outputted from the main amplifier 131. When data is inputted to an input pin DIN0, the write driver 132 imparts a potential based on the input data between the common global input/output line pair GIO0 and /GIO0. When data [1] is inputted to the input pin DIN0, for example, an inverter 41 outputs a signal of L level and an inverter 42 outputs a signal of H level. Furthermore, an inverter 43 outputs a signal of H level and an inverter 44 outputs a signal of H level.

As a result, an N channel MOS transistor 45 and a P channel MOS transistor 48 are turned off, while a P channel MOS transistor 46 and an N channel MOS transistor 47 are turned on. Then, the write driver 132 outputs a signal of H level to the common global input/output line GIO0 and a signal of L level to the common global input/output line /GIO0.

When data [0] is inputted to the input pin DIN0, the inverter 41 outputs a signal of H level and the inverter 42 outputs a signal of L level. Furthermore, the inverter 43 outputs a signal of H level and the inverter 44 outputs a signal of L level.

As a result, the P channel MOS transistor 46 and the N channel MOS transistor 47 are turned off, while the N channel MOS transistor 45 and the P channel MOS transistor 48 are turned on. Then, the write driver 132 outputs a signal of L level to the common global input/output line GIO0 and a signal of H level to the common global input/output line /GIO0.

The switch 19A is turned on/off by a control signal GIOSU from the column decoder 14, while the switch 19B is turned on/off by a control signal GIOSB from the column decoder 145. When data is inputted to or outputted from a plurality of memory cell included in the memory cell blocks 11A and 11B, the column decoders 14 and 15 generate the respective control signals GIOSU and GIOSB such that the switch 19A is turned on, while the switch 19B is turned off. Moreover, when data is inputted to or outputted from a plurality of memory cells included in the memory cell blocks 12A and 12B, the column decoders 14 and 15 generate the respective control signals GIOSU and GIOSB such that the switch 19A is turned off, while the switch 19B is turned on.

Description will be given of reading out data from a plurality of memory cells included in the group 11A1 of the memory cell block 11A. The column select line CSL0 is activated by the column decoder 14. Moreover, the word line driver 11WA activates each of the word line WL00 to WL0n according to a row address decoded by the row decoder 16. Furthermore, the N channel MOS transistors 25 and 26 are turned on by the control signal BLU0 from a control circuit (not shown) and the N channel MOS transistors 31 and 32 are turned on by the control signal LIS00 from the control circuit. Still furthermore, the switch 19A is turned on and the switch 19B is turned off by the control signals GIOSU and GIOSB from the respective decoders 14 and 15.

When the word line WL00 is activated and data [1] is outputted from a memory cell, then the bit line /BL1 assumes a potential $VCC/2+\alpha$, slightly higher than a precharge potential $VCC/2$, while the bit line BL1 remains at the precharge potential $VCC/2$. The potential $VCC/2+\alpha$ on the bit line /BL1 is transmitted to the sense amplifier 11SA1 through the N channel MOS transistor 25, while the potential $VCC/2$ on the bit line BL1 is transmitted to the sense amplifier 11SA1 through the N channel MOS transistor 26. The sense amplifier 11SA1 raises the potential $VCC/2+\alpha$ on the bit line /BL1 to the power source potential VCC, while lowering the potential $VCC/2$ on the bit line BL1 down almost to 0V. That is, the sense amplifier 11SA1 amplifies a potential difference between the bit lines BL1 and /BL1. Then, the potential VCC on the bit line /BL1 is transmitted to the local input/output line /LIO0 through the N channel MOS transistor 27, while the potential 0V on the bit line BL1 is transmitted to the local input/output line LIO00 through the N channel MOS transistor 28.

The local input/output line /LIO00 outputs a potential $VCC-(Vthn+\alpha)$ (Vthn is a threshold voltage of the N channel MOS transistor 32) onto the global input/output line /GIO0A through the N channel MOS transistor 32 and the local input/output line LIO00 outputs the potential 0V onto the global input/output line GIO0A through the N channel MOS transistor 31. Then, the global input/output line /GIO0A transmits the potential $VCC-(Vthn+\alpha)$ onto the common global input/output line /GIO0 through the switch 19A and the global input/output line GIO0A transmits the potential 0V onto the common global input/output line GIO0 through the switch 19A. Then, the main amplifier 131 further amplifies a potential difference between the common global input/output line pair GIO0 and /GIO0, outputs the potential 0V to the gate terminal of the P channel MOS transistor 52 and outputs the potential $VCC-(Vthn+\alpha)$ to the gate terminal of the N channel MOS transistor 51. Then, the P channel MOS transistor 52 and the N channel MOS transistor 51 are turned on, and the output driver 133 outputs a signal of H level, that is data [1], to the output pin DQ0.

When data [0] is outputted from a memory cell connected to the word line WL00, potentials on the bit line pair BL1 and /BL1, the local input/output line pair LIO00 and /LIO00, the global input/output line pair GIO0A and /GIO0A and the common global input/output line pair GIO0 and /GIO0 assume inverted potentials to the respective above described ones and the inverted potentials are inputted to the main amplifier 131. Then, the main amplifier 131 outputs the potential VCC to the gate terminal of the P channel MOS transistor 52 and the 0 V to the gate terminal of the N channel MOS transistor 51. The output driver 133 outputs a signal of L level, that is data [0], to the output pin DQ0.

Description will be given of writing data onto a plurality of memory cells included in the group 11A1 of the memory cell block 11A. When data [1] is inputted to the input pin DIN0, the write driver 132, as described above, raises a potential on the common global input/output line /GIO0 to the potential VCC, while lowering a potential on the common global input/output line GIO0 to the potential 0V. The common global input/output line /GIO0 inputs the potential VCC to the global input/output line /GIO0A through the switch 19A and the common global input/output line GIO0 inputs the potential 0V to the global input/output line GIO0A through the switch 19A.

Then, the global input/output line /GIO0A inputs the potential VCC to the local input/output line /LIO00 through the N channel MOS transistor 32 and the global input/output line GIO0A inputs the potential 0V to the local input/output line LIO00 through the N channel MOS transistor 31. The local input/output line /LIO00 inputs the potential VCC to the bit line /BL1 through the N channel MOS transistor 27 and the local input/output line LIO00 inputs the potential 0V to the bit line BL1 through the N channel MOS transistor 28.

The VCC on the bit line/BL1 is transmitted along the bit line/BL1 through the N channel MOS transistor 25 and written onto a memory cell activated by the word line WL00.

When data [0] is inputted to the input pin DIN0, potentials on the common global input/output line pair GIO0 and /GIO0, the global input/output line pair GIO0A and /GIO0A, the local input/output line pair LIO00 and/LIO00 and the bit line pair BL1 and /BL1 assume inverted potentials to the respective above described potentials. The data [0] is written onto a memory cell activated by the word line WL00.

Likewise, data outputted from each of a plurality of memory cells included in the group 11A2 of the memory cell block 11A is amplified by a sense amplifier 11SB1 and the amplified data is outputted to the main amplifier and the output driver through local input/output line pair LIO101, and /LIO101, a switch 35B, a global input/output line pair GIO1A and /GIO1A, the switch 19A and a common global input/output line pair GIO1 and /GIO1. Besides, following a reverse route of the above described, data is written on each of a plurality of memory cells included in the group 11A2 of the memory cell block 11A.

Data outputted from each of a plurality of memory cells included in the group 11A3 is amplified by the sense amplifier 11SB2 and the amplified data is outputted to the main amplifier and the output driver through the local input/output line pair LIO101 and /LIO101, the switch 35B, the global input/output line pair GIO1A and /GIO1A, the switch 19A and the common global input/output line pair GIO1 and /GIO1. Besides, following a reverse route of the above described, data is written onto each of a plurality of memory cells included in the group 11A3.

Data outputted from each of a plurality of memory cells included in the group 11A4 is amplified by the sense amplifier 11SA2 and the amplified data is outputted to the main amplifier 131 and the output driver 133 through the local input/output line pair LIO00 and /LIO00, the switch 35A, the global input/output line pair GIO0A and /GIO0A, the switch 19A and the common global input/output line pair GIO0 and /GIO0. Besides, following a reverse route of the above described, data is written onto each of a plurality of memory cells included in the group 11A4.

Likewise, data is inputted to or outputted from a memory cell included in the group 12A1 to 12A4 of the memory cell block 12A through a local input/output line pair LIO02 and /LIO02, a local input/output line pair /LIO123 and /LIO123, a global input/output line pair GIO0B and /GIO0B, a global input/output line pair GIO1B and /GIO1B, the switch 19A, the common global input/output line pair GIO0 and /GIO0 and the common global input/output line pair GIO1 and /GIO1. In this case, the column decoders 14 and 15 generate the control signals GIOSU and GIOSB so as to turn the switch 19A off and to turn the switch 19B on.

In the semiconductor memory device 100, one pair, in essence, constituted of the global input/output line pair GIO0A and /GIO0A, and GIO0B and /GIO0B; and one pair, in essence, constituted of the global input/output line pair GIO1A and /GIO1A, and GIO1B and /GIO1B; are placed on respective both sides of all the memory cell blocks 11A, 11B, 12A and 12B.

Figure 15:
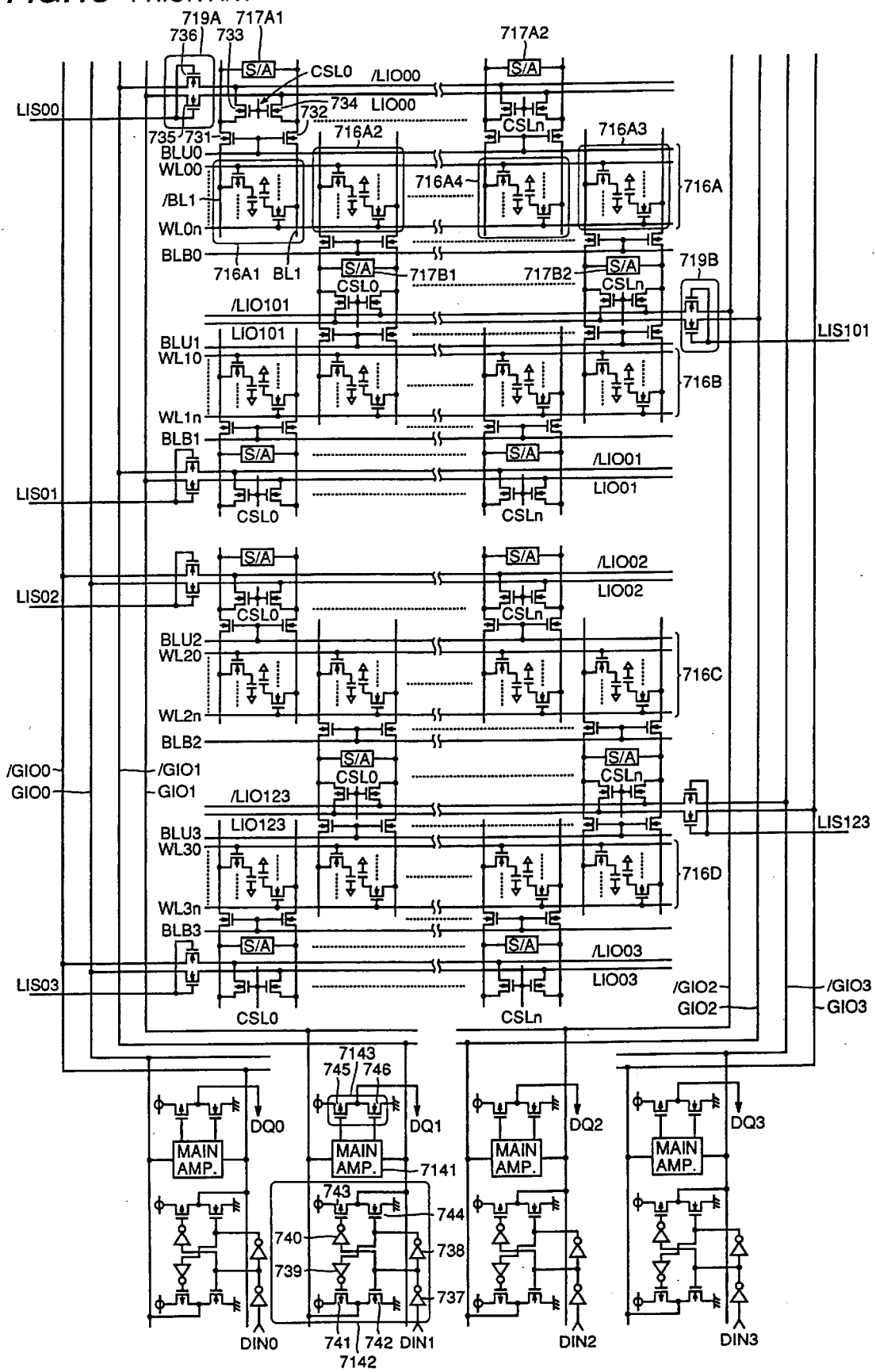
FIG. 15 is a circuit diagram representing part of the circuit diagram shown in FIG. 14.
Figure 16:
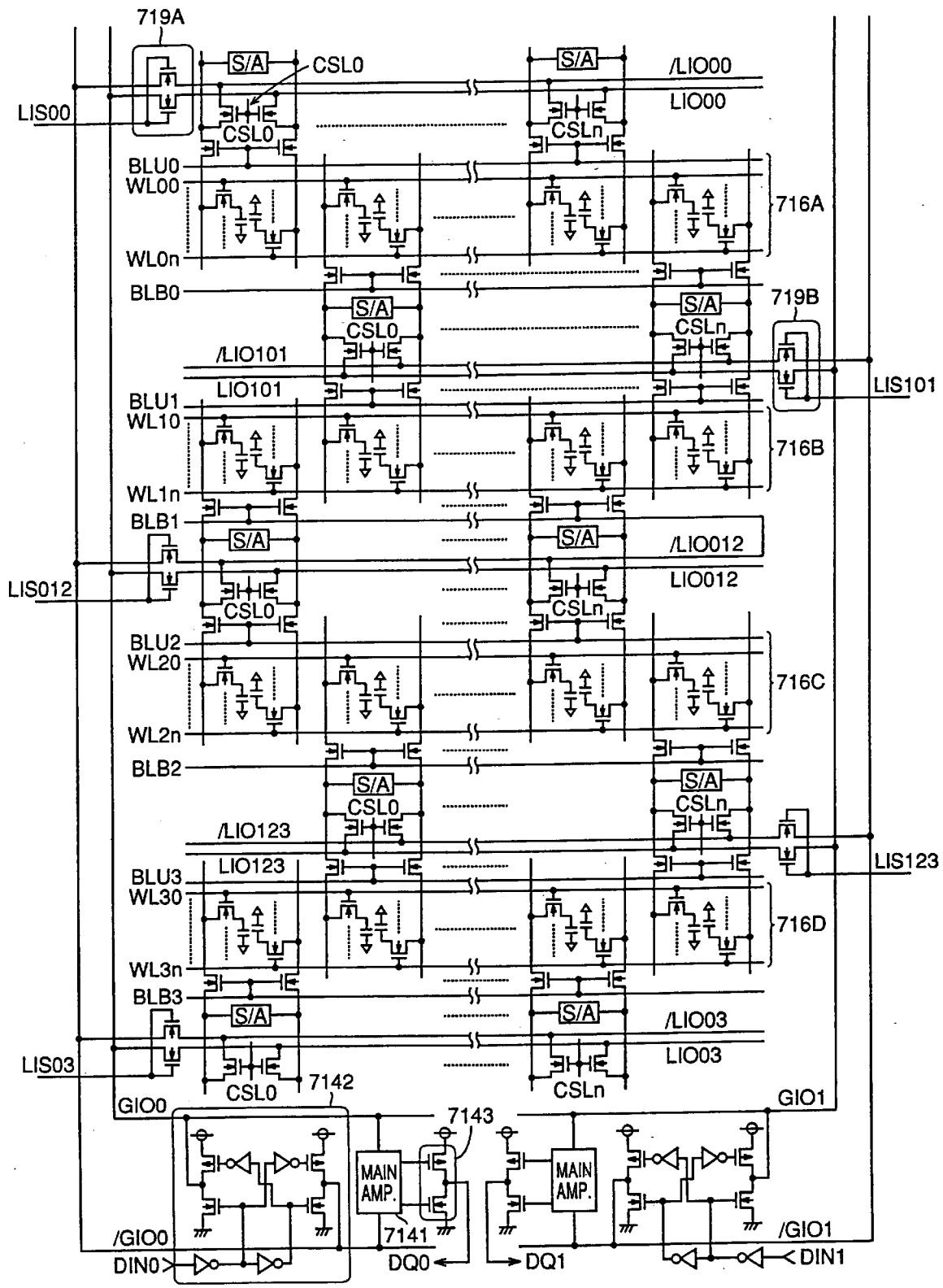
FIG. 16 is another circuit diagram representing part of the circuit diagram shown in FIG. 14.

In contrast to this, in the prior art semiconductor memory device 700 shown in FIG. 15, two pairs, constituted of the global input/output line pair GIO0 and /GIO0, and GIO1 and /GIO1; and two pairs constituted of the global input/output line pair GIO2 and /GIO2, and G1O3 and /GIO3; are placed on respective both sides of the memory cell array.

Hence, when the input/output circuit zone 13 is placed between the memory cell arrays 11 and 12, then, an occupancy area of the global input/output line pairs can be smaller.

Furthermore, the semiconductor memory device 100 selectively inputs or outputs data to or from a plurality of memory cells included in the memory cell blocks 11A and 11B or a plurality of memory cells included in the memory cell blocks 12A and 12B by two sets of the main amplifier 131, the write driver 132 and the output driver 133. Note that one set of the main amplifier 131, the write driver 132 and the output driver 133 constitutes one input/output circuit.

FIG. 3 shows the case where each of the regions 10, 20, 30 and 40 inputs or outputs data with 4 bits as a unit, wherein the input/output circuit zone 13 inputs or outputs data of 4 bits as a unit to or from a plurality of memory cells included in the memory cell blocks 11A and 11B and inputs or outputs data of 4 bits as a unit to or from a plurality of memory cells included in the memory cell blocks 12A and 12B. Inputting or outputting data to or from a plurality of memory cell included in the memory cell blocks 11A and 11B, and inputting or outputting data to or from a plurality of memory cell included in the memory cell blocks 12A and 12B, are selectively switched over using the switches 19A and 19B, and thereby, data of 4 bits is inputted to or outputted from the regions 10, 20, 30 and 40. In this case, two input/output circuits are provided in each of the regions 10, 20, 30 and 40.

In the present invention, not limiting to a case where the regions 10, 20, 30 and 40 perform inputting and outputting data of 4 bits, the regions 10, 20, 30 and 40 generally input or output data of n bits (n is a natural number). In this case, an input/output circuit 13 is constituted of n input/output circuits. The input/output circuit zone 13 inputs or outputs data of n bits to or from a plurality of memory cells included in the memory cell blocks 11A and 11B or a plurality of memory cells included in the memory cell blocks 12A and 12B selectively. In this case, n input/output circuits are provided in each of the regions 10, 20, 30 and 40.

On the other hand, the prior art semiconductor memory device 700, as shown in FIG. 15, inputs or outputs data to or from a plurality of memory cells included in the memory cell blocks 716A, 716B, 716C and 716D using 4 sets of the main amplifier 7141, the write driver 7142 and the output driver 7143.

Hence, a configuration for inputting/outputting 4 bit data can be realized in the semiconductor memory device 100 with circuits in number of half that in the prior art semiconductor memory device 700. As a result, the semiconductor memory device 100 can be fabricated with the input/output circuit zone 13 in occupancy area of half that in the prior art semiconductor memory device 700. Besides, power consumption in the semiconductor memory device 100 can be reduced half that in the prior art semiconductor memory device 700.

Furthermore, in the semiconductor memory device 100, in a test mode, by turning on the switches 19A and 19B simultaneously, data are inputted or outputted to or from memory cells with the same address among a plurality of memory cells included in the memory cell blocks 11A and 11B, and a plurality of memory cells included in the memory cell blocks 12A and 12B while using one input/output circuit zone 13. Thereby, a test time can be reduced by half.

Still further, by placing the input/output circuit zone 13 between the memory cell arrays 11 and 12, the 4 input/output circuit zones 13 included in the regions 10, 20, 30 and 40 are in a distributed state of placement, which enables prevention of local concentration of power consumption.

According to the first embodiment, in a semiconductor memory device, one bank is divided into two memory cell arrays and an input/output circuit zone is placed between the two memory cell arrays; therefore, a total occupancy area for the input/output circuit zones can be reduced. Besides, not only can low power consumption be realized, but local concentration of power consumption can also be prevented.

[Second Embodiment]

Figure 4:
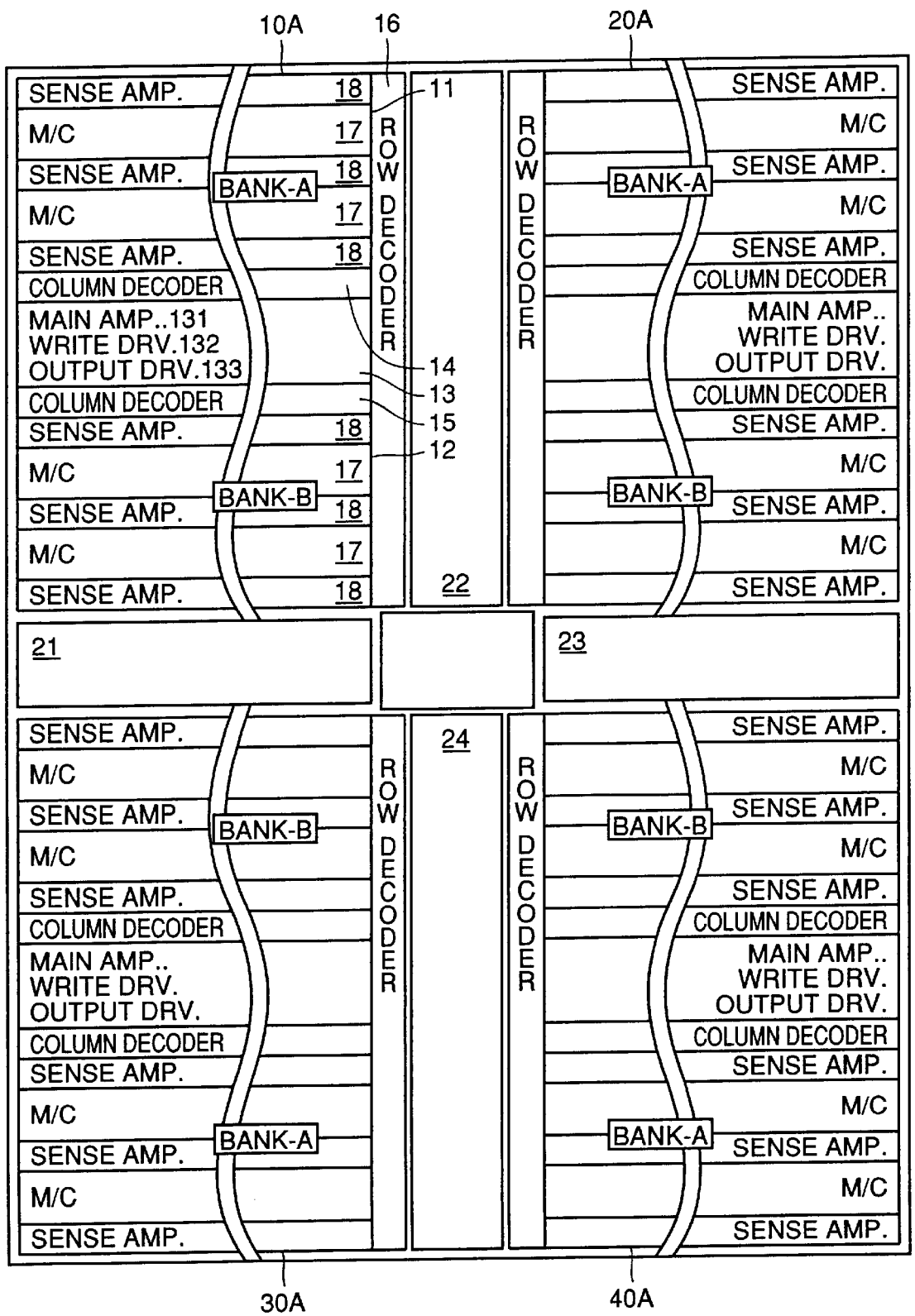
FIG. 4 is a schematic block diagram of a semiconductor memory device according to a second embodiment of the present invention.

Referring to FIG. 4, a semiconductor memory device 200 has a configuration in which only the regions 10, 20, 30 and 40 of the semiconductor memory device 100 are replaced with the regions 10A, 20A, 30A and 40A, while the other part being the same as the semiconductor memory device 100.

In the semiconductor memory device 200, the region 10A includes memory cell arrays 11 and 12, an input/output circuit zone 13, column decoders 14 and 15, and a row decoder 16. That is, the region 10A is constructed from the same constituents as the region 10 of the semiconductor memory device 100. What the region 10A is different from the region 10 is that each of the memory cell arrays 11 and 12 constitutes one different bank. Hence, the memory cell 11 array constitutes a bank A, while the memory cell array 12 constitutes a bank B. In this case, the input/output circuit zone 13 is placed between the banks A and B. The regions 20A, 30A and 40A are of the same configuration as the region 10A.

The other part of the configuration is the same as in the first embodiment.

According to the second embodiment, since an input/output circuit zone is placed between two banks, a total occupancy area of input/output circuit zones can be reduced even in a semiconductor memory device of a 2 bank configuration. Besides, not only can low power consumption be realized, but local concentration of power consumption can also be prevented.

[Third Embodiment]

Figure 5:
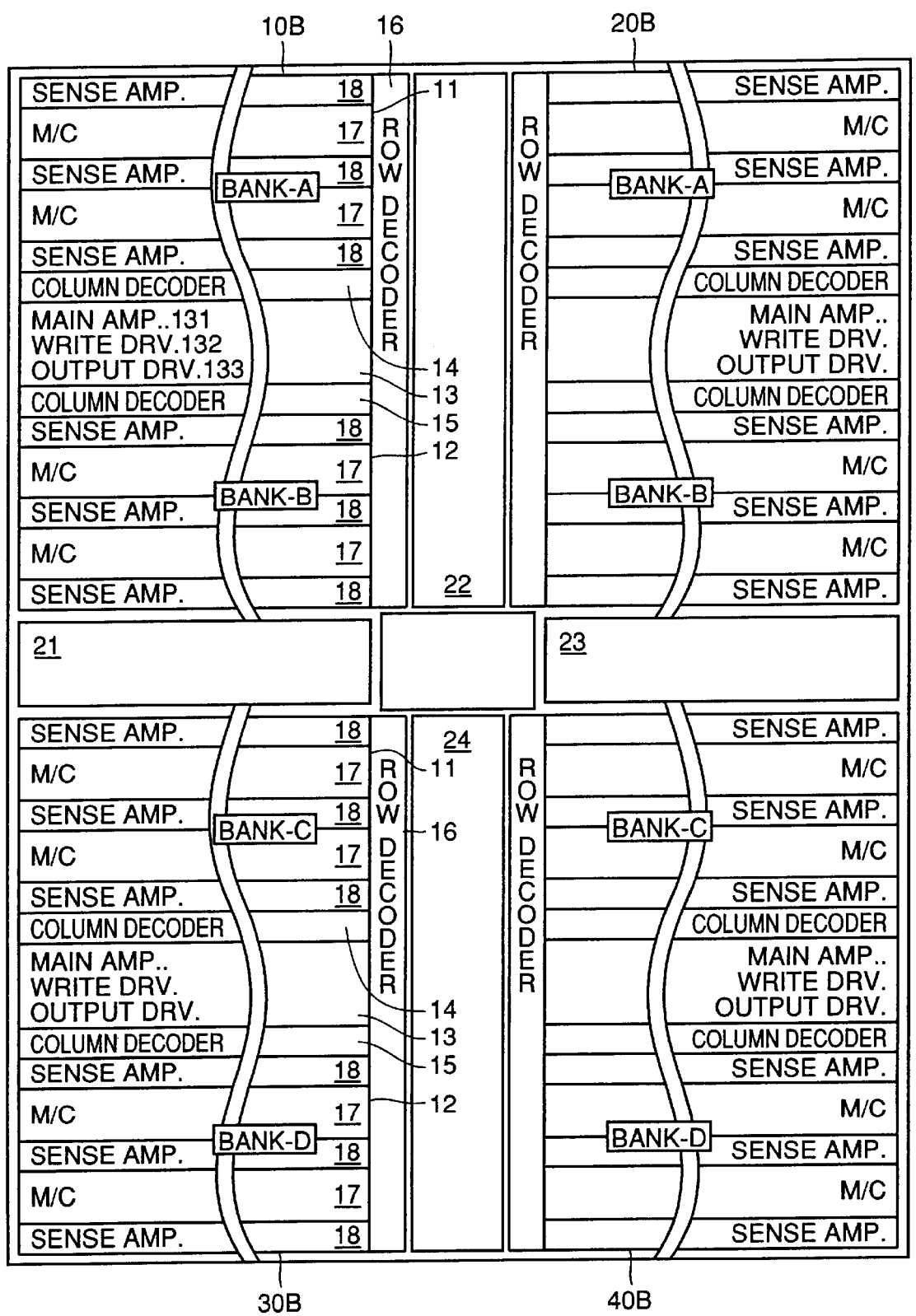
FIG. 5 is a schematic block diagram of a semiconductor memory device according to a third embodiment of the present invention.

Referring to FIG. 5, a semiconductor memory device 300 according to the third embodiment has a configuration in which only the regions 10, 20, 30 and 40 of the semiconductor memory device 100 are replaced with the regions 10B, 20B, 30B and 40B while the other part being the same as the semiconductor memory device 100.

In the semiconductor memory device 300, the regions 10B and 30B each include memory cell arrays 11 and 12, an input/output circuit zone 13, column decoders 14 and 15, and a row decoder 16. That is, the regions 10B and 30B are constructed from the same constituents as the regions 10 and 30 of the semiconductor memory device 100. What the region 10B is different from the region 10 is that each of the memory cell arrays 11 and 12 constitutes one different bank. Besides, what the region 30B is different from the region 30 in is that each of the memory cell arrays 11 and 12 constitutes one different bank. In other words, in the semiconductor memory device 300, the region 30B is constituted of two banks different from two banks constituting the region 10B. Hence, in the region 10B, the memory cell array 11 constitutes a bank A, while the memory cell array 12 constitutes a bank B. Furthermore, in the region 30B, the memory cell 11 array constitutes a bank C, while the memory cell array 12 constitutes a bank D. The region 20B is of the same configuration as the region 10B and the region 40B is of the same configuration as the region 30B.

In this case, in the regions 10B and 20B, the input/output circuit zone 13 is placed between the banks A and B, and in the regions 30B and 40B, the input/output circuit 13 is placed between the banks C and D.

The other part of the configuration is the same as in the first embodiment.

According to the third embodiment, since input/output circuit zones are placed between the banks A and B, and between the banks C and D, respectively, therefore a total occupancy area of input/output circuit zones can be reduced even in a semiconductor memory device of a 4 bank configuration. Besides, not only can low power consumption be realized, but local concentration of power consumption can also be prevented.

[Fourth Embodiment]

Figure 6:
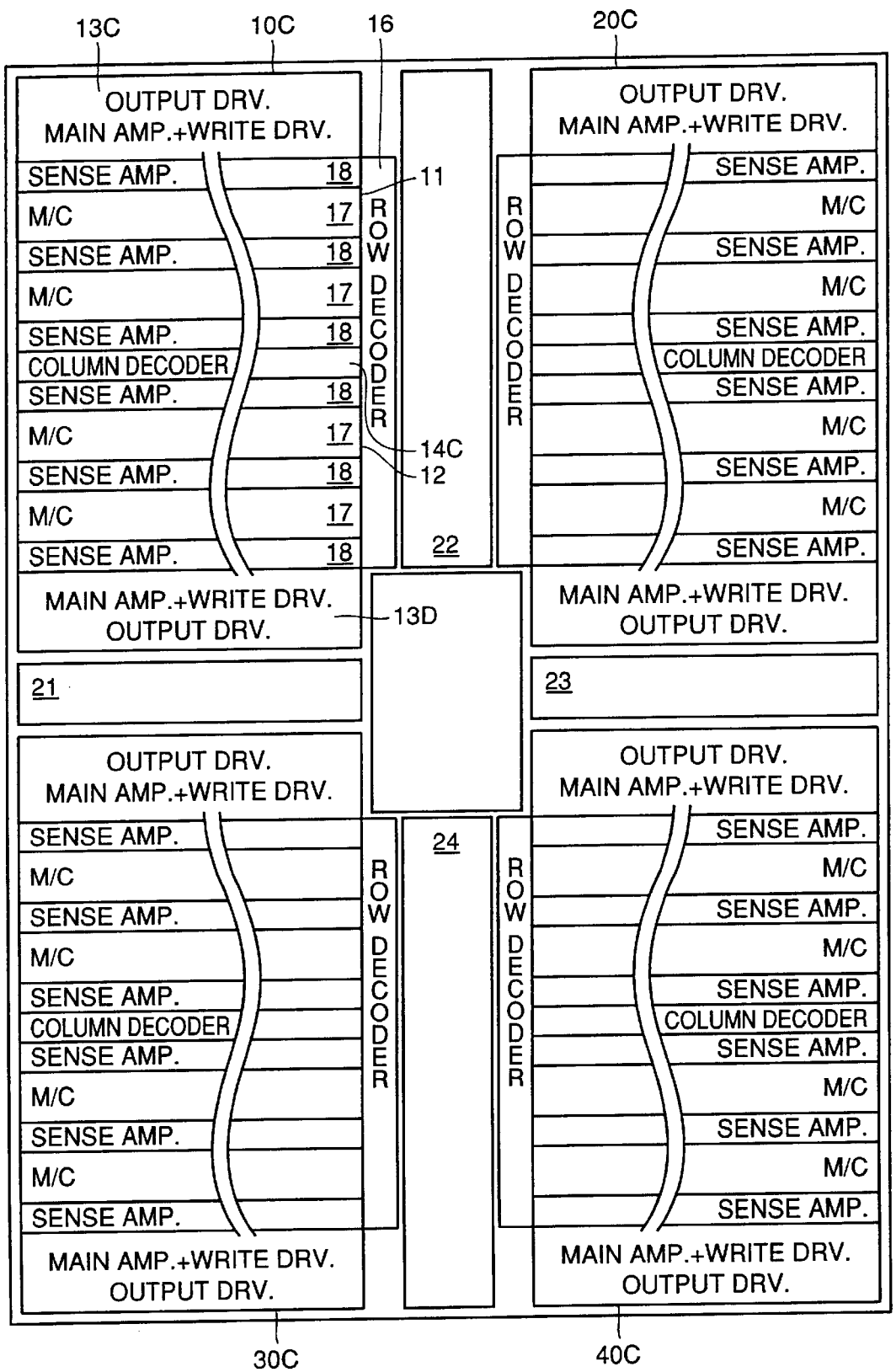
FIG. 6 is a schematic block diagram of a semiconductor memory device according to a fourth embodiment of the present invention.

Referring to FIG. 6, a semiconductor memory device 400 according to the fourth embodiment has a configuration in which only the regions 10, 20, 30 and 40 of the semiconductor memory device 100 are replaced with the regions 10C, 20C, 30C and 40C, while the other part being the same as the semiconductor memory device 100.

The region 10C includes memory cell arrays 11 and 12, input/output circuit zones 13C and 13D, a column decoder 14C, and a row decoder 16. The column decoder 14C is placed between the memory cell arrays 11 and 12. The input/output circuit zones 13C and 13D are placed on both outermost sides of arrangement of the memory cell arrays 11 and 12 and the column decoder 14C so as to sandwich the arrangement therebetween. The input/output circuit zone 13C inputs or outputs data to or from a plurality of memory cells included in the memory cell array 11. The input/output circuit zone 13D inputs or outputs data to or from a plurality of memory cells included in the memory cell 12. The column decoder 14C decodes a column address based on an address signal inputted from an address terminal (not shown) and selects a memory cell included in the memory cell array 11 and a memory cell included in the memory cell array 12 simultaneously according to the same column address obtained by the decoding.

The regions 20C, 30C and 40C are of the same configuration as the region 10C.

Figure 7:
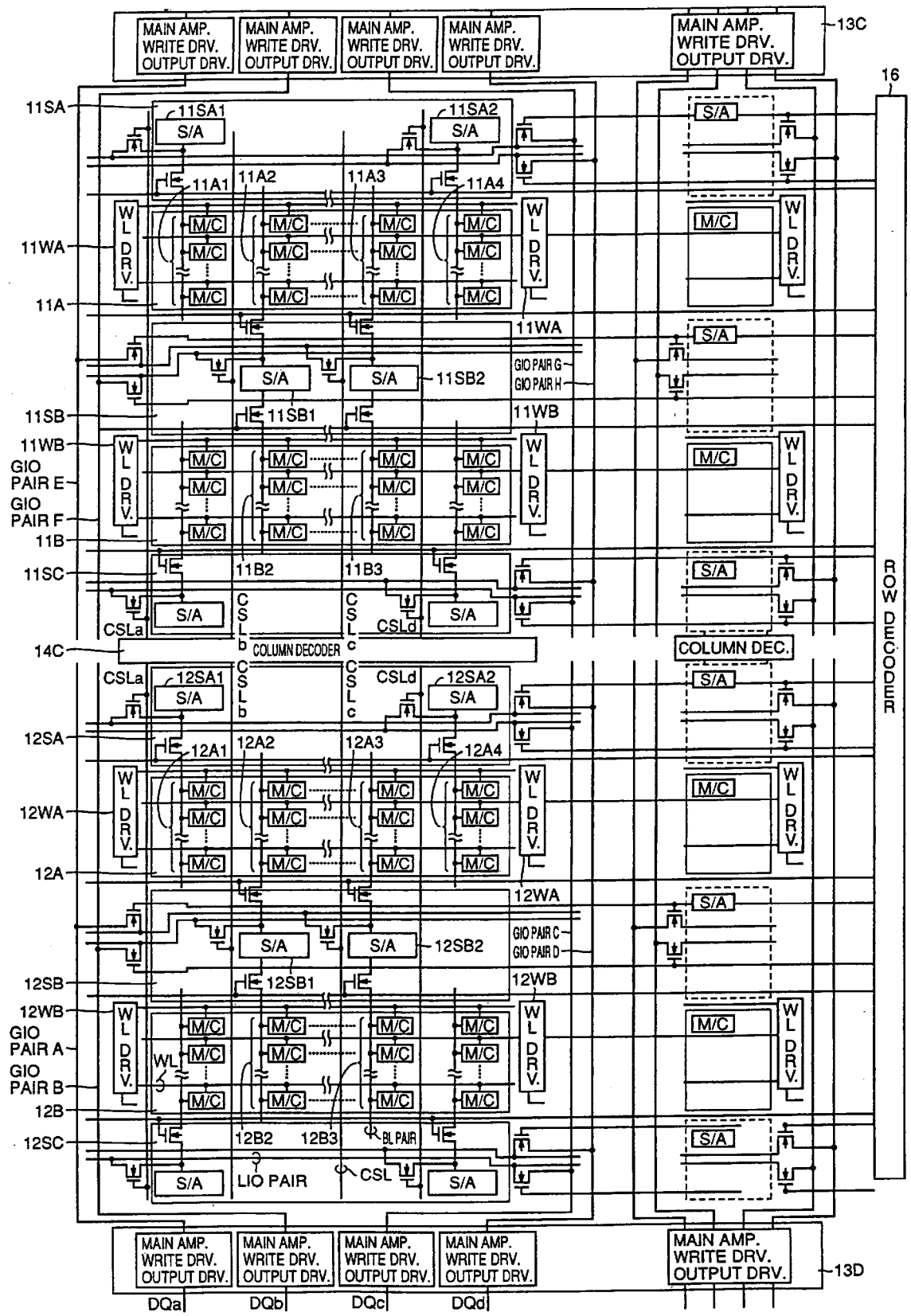
FIG. 7 is a circuit diagram of part of the circuit diagram shown in FIG. 6.

FIG. 7 is a circuit diagram representing part of the region C shown in FIG. 6.

Memory cell blocks 11A and 11B are connected to the input/output circuit zone 13C through global input/output line pairs GIOE and GIOF, GIOG and GIOH. Furthermore, Memory cell blocks 12A and 12B are connected to the input/output circuit zone 13D through global input/output line pairs GIOA and GIOB, GIOC and GIOD.

When a plurality of memory cells M/C, M/C, ... included in a group 11A1 of the memory cell block 11A and a plurality of memory cells M/C, M/C, ... included in the group 12A1 of a memory cell block 12A are sequentially specified by the column decoder 14C, the row decoder 16 and word line drivers 11WA and 12WA, then sense amplifiers 11SA1 and 12SA1 each amplify data read out from each cell. Then, the sense amplifier 11SA1 outputs the amplified data to the input/output circuit zone 13C through the global input/output line pair GIOG. The sense amplifier 12SA1 outputs the amplified data to the input/output circuit zone 13D through the global input/output line pair GIOD.

Moreover, likewise, when a plurality of memory cells M/C, M/C, ... included in a group 11A4 of the memory cell block 11A and a plurality of memory cells M/C, M/C, ... included in a group 12A4 of the memory cell block 12A are sequentially specified, then sense amplifiers 11SA2 and 12SA2 each amplify data read out from each cell. Then, the sense amplifier 11SA2 outputs the amplified data to the input/output circuit zone 13C through the global input/output line pair GIOH. The sense amplifier 12SA2 outputs the amplified data to the input/output circuit zone 13D through the global input/output line pair GIOC. Furthermore, the sense amplifiers 11SA1 and 11SA2 amplify data outputted from not only a plurality of memory cells included in the memory cell block 11A, but also a plurality of memory cells included in a memory cell block (not shown) residing in the opposite side from the memory cell array 11A and output the amplified data to the input/output circuit zone 13C through the respective global input/output line pairs GIOG and GIOH. The sense amplifiers 12SA1 and 12SA2 amplify data outputted from not only a plurality of memory cells included in the memory cell block 12A, but also a plurality of memory cells included in a memory cell block (not shown) residing in the opposite side from the memory cell array 12A and output the amplified data to the input/output circuit zone 13D through the respective global input/output line pairs GIOC and GIOD.

Moreover, when a plurality of memory cells M/C, M/C, . . . included in a group 11A2 of the memory cell block 11A and a plurality of memory cells M/C, M/C, . . . included in the group 12A2 of the memory cell block 12A are sequentially specified, then sense amplifiers 11SB1 and 12SB1 each amplify data read out from each cell. Then, the sense amplifier 11SB1 outputs the amplified data to the input/output circuit zone 13C through the global input/output line pair GIOF. The sense amplifier 12SB1 outputs the amplified data to the input/output circuit zone 13D through the global input/output line pair GIOB.

Besides, the sense amplifier 11SB1 also amplify data outputted from a plurality of memory cells M/C, M/C, . . . included in a group 11B2 of the memory cell block 11B and outputs the amplified data to the input/output circuit zone 13C through the global input/output line pair GIOF. The sense amplifier 12SB1 also amplify data outputted from a plurality of memory cells M/C, M/C, . . . included in a group 12B2 of the memory cell block 12B and outputs the amplified data to the input/output circuit zone 13D through the global input/output line pair GIOB.

Still moreover, when a plurality of memory cells M/C, M/C, . . . included in a group 11A3 of the memory cell block 11A and a plurality of memory cells M/C, M/C, . . . included in a group 12A3 of the memory cell block 12A are sequentially specified, sense amplifiers 11SB2 and 12SB2 each amplify data read out from each cell. Then, the sense amplifier 11SB2 outputs the amplified data to the input/output circuit zone 13C through the global input/output line pair GIOE. The sense amplifier 12SB2 outputs the amplified data to the input/output circuit zone 13D through the global input/output line pair GIOA.

Besides, the sense amplifier 11SB2 also amplify data outputted from a plurality of memory cells M/C, M/C, . . . included in a group 11B3 of the memory cell block 11B and outputs the amplified data to the input/output circuit zone 13C through the global input/output line pair GIOE. The sense amplifier 12SB2 also amplify data outputted from a plurality of memory cells M/C, M/C, . . . included in the group 12B3 of the memory cell block 12B and outputs the amplified data to the input/output circuit zone 13D through the global input/output line pair GIOA.

Hence, data read out from a plurality of memory cells included in the memory cell array 11A is amplified by sense amplifier groups 11SA or 11SB and the amplified data is outputted to the input/output circuit zone 13C through the global input/output line pairs GIOE, GIOF, GIOG and GIOH. Furthermore, data read out from a plurality of memory cells included in the memory cell array 12A is amplified by sense amplifier groups 12SA or 12SB residing on both sides thereof and the amplified data is outputted to the input/output circuit zone 13D through the global input/output line pairs GIOA, GIOB, GIOC and GIOD.

This applies to a plurality of memory cells included in the other memory cell arrays 11B and 12B in a similar way.

Figure 8:
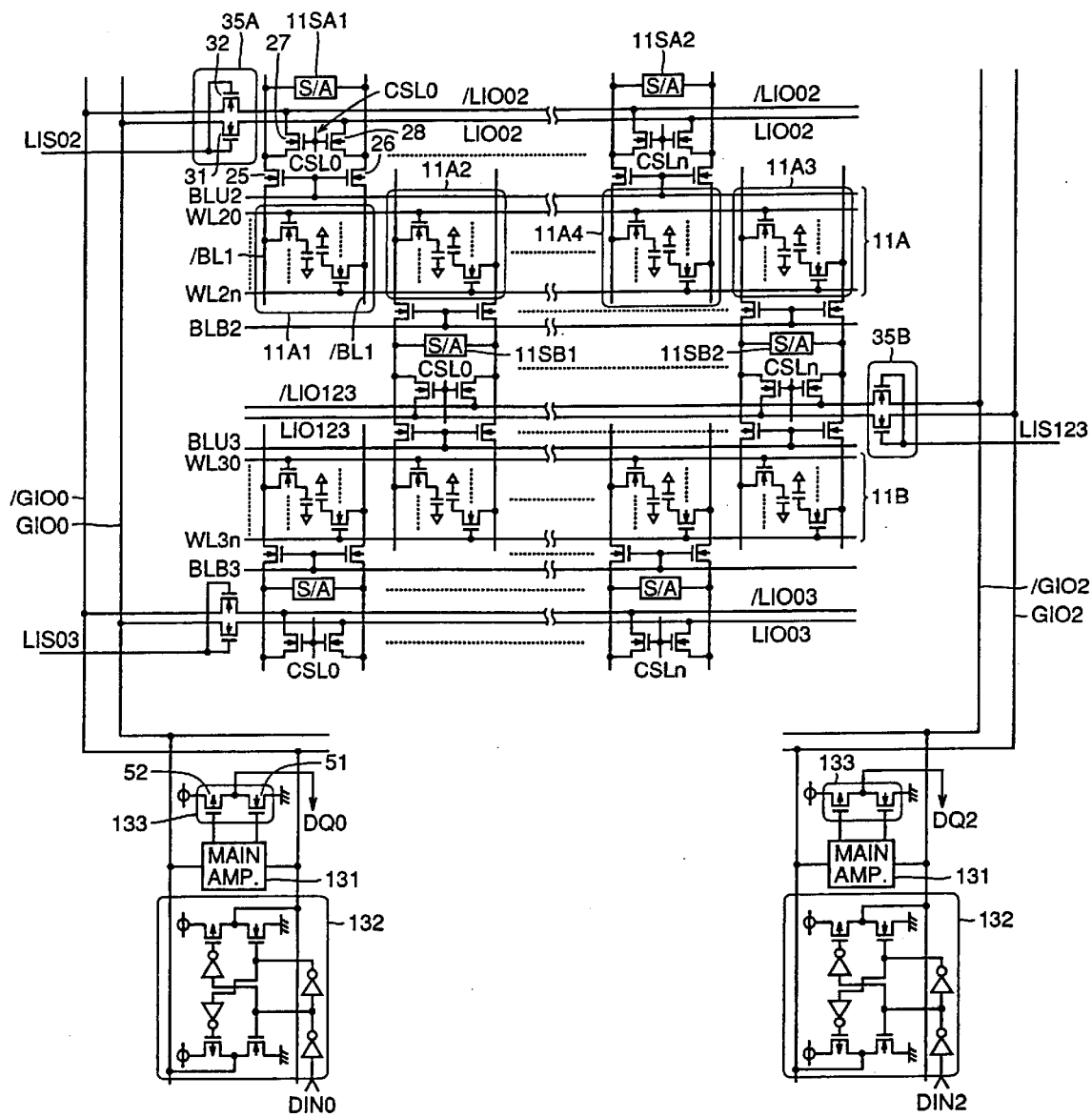
FIG. 8 is a circuit diagram of part of the circuit diagram shown in FIG. 7.

Referring to FIG. 8, detailed description will be given of inputting/outputting data to or from a memory cell. The group 11A1 of the memory cell block 11A includes a plurality of memory cells. The plurality of memory cells are connected to word lines WL20 to WL2n extending in the row direction and bit line pair BL1 and /BL1 extending in the column direction. An N channel MOS transistor 25 is inserted in the bit line /BL1 and an N channel MOS transistor 26 is inserted in the bit line BL1. The N channel MOS transistors 25 and 26 are turned on/off by a control signal BLU2.

The sense amplifier 11SA1 is connected between the bit line pair BL1 and /BL1. The bit line BL1 is connected to a local input/output line LIO02 through an N channel MOS transistor 28. The bit line /BL1 is connected to a local input/output line /LIO02 through an N channel MOS transistor 27. The N channel MOS transistors 27 and 28 are turned on/off in company with activation/deactivation of a column select line CSL0 connected to the column decoder 14C.

The local input/output line LIO02 is connected to a global input/output line GIO0 through an N channel MOS transistor 31 and the local input/output line /LIO02 is connected to a global input/output line /GIO0 through an N channel MOS transistor 32. The N channel MOS transistors 31 and 32 are turned on/off by a control signal LIS02. Note that the N channel MOS transistors 31 and 32 constitute a switch 35A connecting the local input/output line pair and the global input/output line pair therebetween.

The global input/output line pairs GIO0 and /GIO0 are connected to a main amplifier 131 and a write driver 132. An output write driver 133 is connected to the main amplifier 131.

Description will be given of reading out data from a plurality of memory cells included in the group 11A1 of the memory cell block 11A. The column select line CSL0 is activated by the column decoder 14C. The word line driver 11WA activates each of the word line WL20 to WL2n according to a row address decoded by the row decoder 16. Furthermore, the N channel MOS transistors 25 and 26 are turned on by a control signal BLU2 from a control circuit (not shown) and the N channel MOS transistors 31 and 32 are turned on by a control signal LIS02 from the control circuit.

When the word line WL20 is activated and data [1] is outputted from a memory cell, then the bit line /BL1 assumes a potential VCC/2+$\alpha$, slightly higher than a precharge potential VCC/2, while the bit line BL1 remains at the precharge potential VCC/2. The potential VCC/2+$\alpha$ on the bit line /BL1 is transmitted to the sense amplifier 11SA1 through the N channel MOS transistor 25, while the potential VCC/2 on the bit line BL1 is transmitted to the sense amplifier 11SA1 through the N channel MOS transistor 26. The sense amplifier 11SA1 raises the potential VCC/2+$\alpha$ on the bit line /BL1 to the power source potential VCC, while lowering the potential VCC/2 on the bit line BL1 down almost to 0 V. That is, the sense amplifier 11SA1 amplifies a potential difference between the bit lines BL1 and /BL1. Then, the potential VCC on the bit line /BL1 is transmitted onto the local input/output line /LI02 through the N channel MOS transistor 27, while the potential 0V on the bit line BL1 is transmitted onto the local input/output line LIO02 through the N channel MOS transistor 28.

The local input/output line /LIO02 outputs a potential VCC-(Vthn+$\alpha$) onto the global input/output line /GIO0 through the N channel MOS transistor 32 and the local input/output line LIO02 outputs the potential 0V onto the global input/output line GIO0 through the N channel MOS transistor 31. Then, the main amplifier 131 further amplifies a potential difference between the global input/output line pair GIO0 and /GIO0, outputs the potential 0V to the gate terminal of a P channel MOS transistor 52 and outputs the potential VCC−(Vthn+α) to the gate terminal of an N channel MOS transistor 51. Then, the P channel MOS transistor 52 and the N channel MOS transistor 51 are turned on, and the output driver 133 outputs a signal of H level, that is data [1], to an output pin DQ0.

When data [0] is outputted from a memory cell connected the word line WL20, potentials on the bit line pair BL1 and /BL1, the local input/output line pair LIO02 and /LIO02 and the global input/output line pair GIO0 and /GIO0 assume inverted potentials to the above described ones and the inverted potentials are inputted to the main amplifier 131. Then, the main amplifier 131 outputs the potential VCC−(Vthn+α) to the gate terminal of the P channel MOS transistor 52, while imparting the potential 0V to the gate terminal of the N channel MOS transistor 51. The output driver 133 outputs a signal of L level, that is data [0], to an output pin DQ0.

Description will be given writing data onto a plurality of memory cells included in the group 11A1 of the memory cell block 11A. When data [1] is inputted to an input pin DIN0, the write driver 132, as described above, raises a potential on the global input/output line /GIO0 to the potential VCC, while lowering a potential on the global input/output line GIO0 to the potential 0V.

Then the global input/output line /GIO0 inputs the potential VCC to the local input/output line /LIO02 through the N channel MOS transistor 32 and the global input/output line GIO0 inputs the potential 0V to the local input/output line LIO02 through the N channel MOS transistor 31. The local input/output line /LIO02 inputs the potential VCC to the bit line /BL1 through the N channel MOS transistor 27 and the local input/output line LIO02 inputs the potential 0V to the bit line BL1 through the N channel MOS transistor 28.

The potential VCC on the bit line/BL1 is transmitted along the bit line/BL1 through the N channel MOS transistor 25 and written onto a memory cell activated by the word line WL00.

When data [0] is inputted to the input pin DIN0, potentials on the global input/output line pair GIO0 and /GIO0, the local input/output line pair LIO00 and /LIO00 and the bit line pair BL1 and/BL1 assume inverted potentials to the above described potentials. The data [0] is written onto a memory cell activated by the word line WL00.

Likewise, data outputted from each of a plurality of memory cells included in the group 11A2 of the memory cell block 11A is amplified by the sense amplifier 11SB1 and the amplified data is outputted to the main amplifier 131 and the output driver 133 through a local input/output line pair LIO123 and /LIO123, a switch 35B and a global input/output line pair GIO2 and /GIO2. Besides, following a reverse route of the above described, data is written onto each of a plurality of memory cells included in the group 11A2 of the memory cell block 11A.

Data outputted from each of a plurality of memory cells included in the group 11A3 is amplified by the sense amplifier 11SB2 and the amplified data is outputted to the main amplifier and the output driver through the local input/output line pair LIO123 and /LIO123, the switch 35B and the global input/output line pair GIO2 and /GIO2. Besides, following a reverse route of the above described, data is written onto each of a plurality of memory cells included in the group 11A3.

Data outputted from each of a plurality of memory cells included in the group 11A4 is amplified by the sense amplifier 11SA2 and the amplified data is outputted to the main amplifier 131 and the output driver 133 through the local input/output line pair LIO02 and /LIO02, the switch 35A and the global input/output line pair GIO2 and /GIO2. Besides, following a reverse route of the above described, data is written onto each of a plurality of memory cells included in the group 11A4.

Likewise, data is inputted to or outputted from a memory cell included in the groups 12A1 to 12A4 of the memory cell block 12A through the local input/output line pair LIO02 and /LIO02, the local input/output line pair LIO123 and /LIO123, the switch 35B, the global input/output line pair GIO0 and /GIO0 and the global input/output line pair GIO2 and /GIO2.

In the semiconductor memory device 400, the input/output circuit zones 13C and 13D are placed on both outermost sides of the memory cell blocks 11A, 11B, 12A and 12B. Furthermore, in the semiconductor memory device 400, the column decoder 14C is placed between a pair of the memory cell blocks 11A and 11B and a pair of the memory cell blocks 12A and 12B. The column decoder 14C selects a memory cell included in the memory cell blocks 11A and 11B, and a memory cell included in the memory cell blocks 12A and 12B simultaneously and the input/output circuit zone 13C inputs or outputs data to or from a memory cell included in the memory cell blocks 11A and 11B and the input/output circuit 13D inputs or outputs data to or from a memory cell included in the memory cell blocks 12A and 12B.

Therefore, input/output circuit zones inputting or outputting data to or from a memory cell can be distributed on the device in placement. As a result, local concentration of power consumption can be prevented. Furthermore, malfunction of adjacent circuits due to local concentration of power consumption can be prevented.

According to the fourth embodiment, since a semiconductor memory device is configured such that two input/output circuit zones are provided to one bank, input/output circuit zones can be distributed in placement, thereby enabling prevention of local concentration of power consumption.

[Fifth Embodiment]

Figure 9:
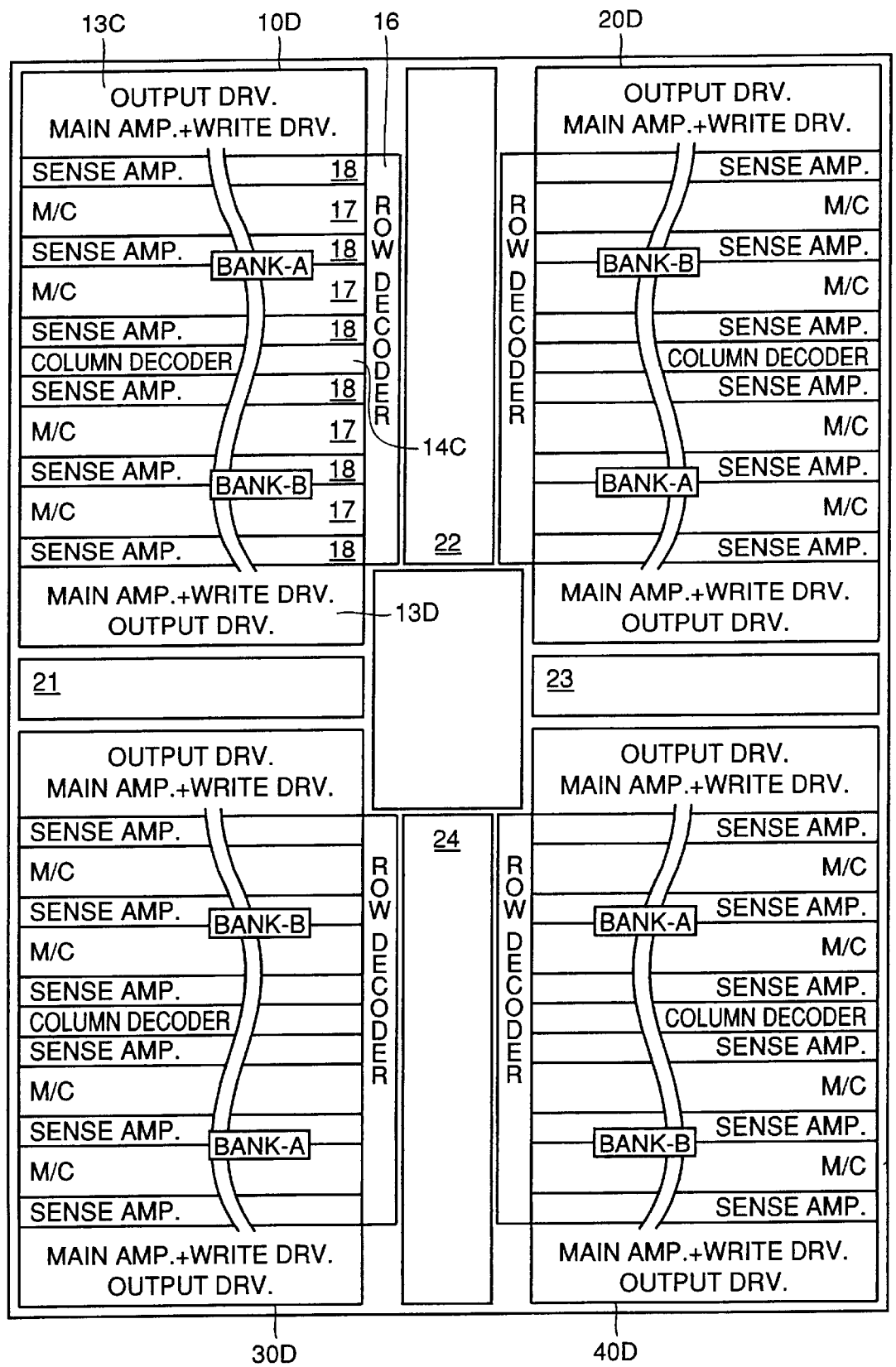
FIG. 9 is a schematic block diagram of a semiconductor memory device according to a fifth embodiment of the present invention.

Referring to FIG. 9, a semiconductor memory device 500 according to the fifth embodiment has a configuration in which only the regions 10C, 20C, 30C and 40C of the semiconductor memory device 400 are replaced with the regions 10D, 20D, 30D and 40D , while the other part being the same as the semiconductor memory device 400.

The region 10D includes memory cell arrays 11 and 12, input/output circuit zones 13C and 13D, a column decoder 14C, and a row decoder 16. That is, the region 10D is constructed of the same constituents as the region 10C of the semiconductor memory device 400. What the region 10D is different from the region 10C is that each of the memory cell arrays 11 and 12 constitutes one different bank. Hence, the memory cell array 11 constitutes a bank A and the memory cell array 12 constitutes a bank B. In this case, the input/output circuit zone 13C inputs or outputs data to or from a plurality of memory cells included in the bank A and the input/output circuit zone 13D inputs or outputs data to or from a plurality of memory cells included in the bank B. The regions 20D, 30D and 40D are of the same configuration as the region 10D.

Figure 10:
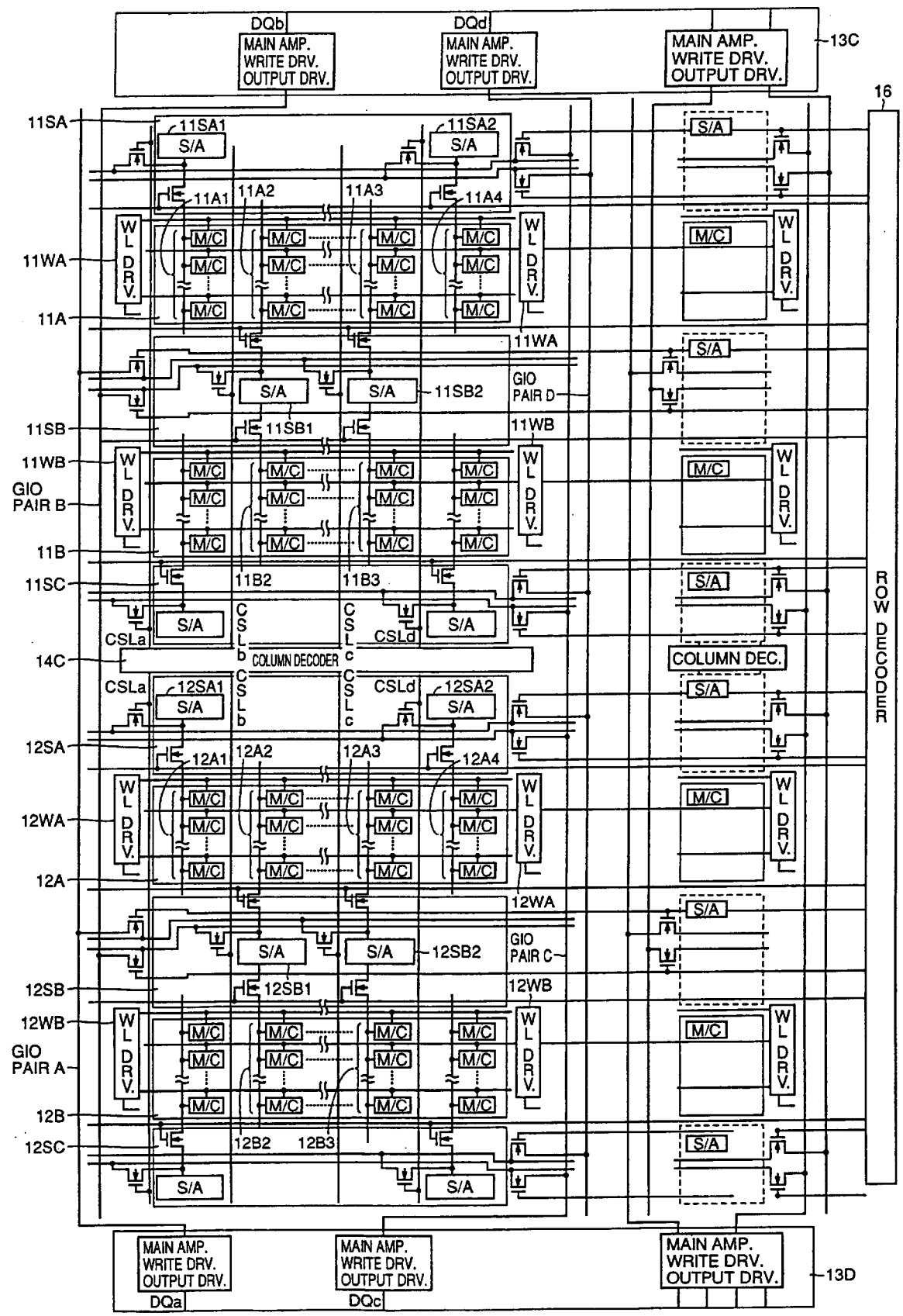
FIG. 10 is a circuit diagram of part of the circuit diagram shown in FIG. 9.

In FIG. 10, shown is part of the region 10D of the semiconductor memory device 500 shown in FIG. 9. Operation of inputting or outputting data to or from a memory cell included in memory cell blocks 11A, 11B, 12A and 12B is the same as in the description of FIG. 7. Note that while FIG. 7 represents a circuit diagram inputting or outputting data of 4 bits as a unit, FIG. 10 represents a circuit diagram inputting or outputting data of 2 bits as a unit. Hence, in FIG. 10, shown are four global input/output line pairs GIOA, GIOB, DIOC and DIOD.

Figure 11:
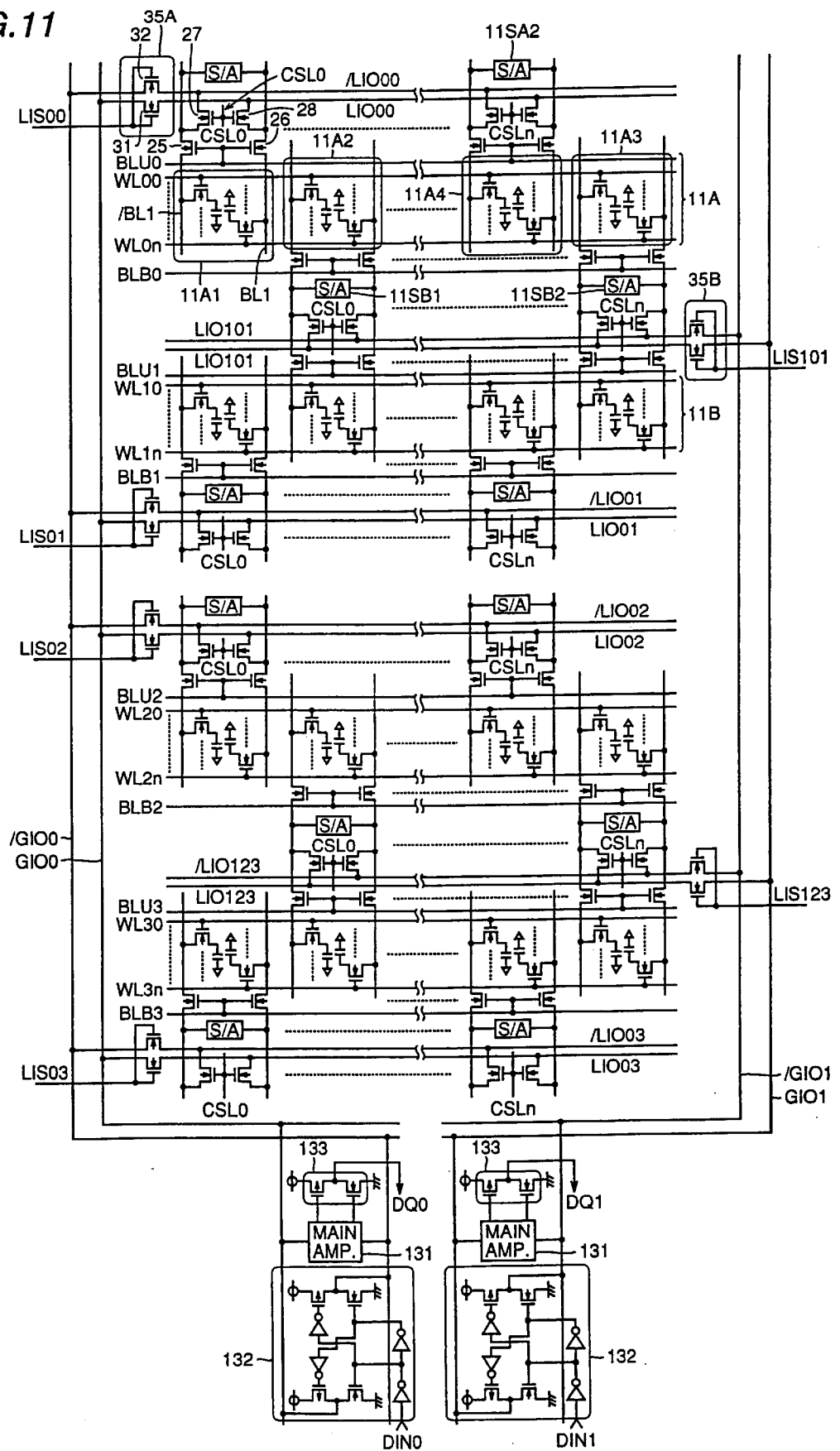
FIG. 11 is a circuit diagram of part of the circuit diagram shown in FIG. 10.

FIG. 11 is a circuit diagram for detailed description of inputting or outputting data to or from a plurality of memory cells included in the memory cell arrays 11A and 11B and corresponds to FIG. 8 in the fourth embodiment. Detailed description thereof is the same as that of FIG. 8.

The other part of the configuration is the same as that of the fourth embodiment.

According to the fifth embodiment, since two input/output circuit zones are placed so as to sandwich the banks A and B therebetween, input/output circuit zones can be distributed in placement even in a semiconductor memory device of a 2 bank configuration. As a result, local concentration of power consumption can be prevented.

[Sixth Embodiment]

Figure 12:
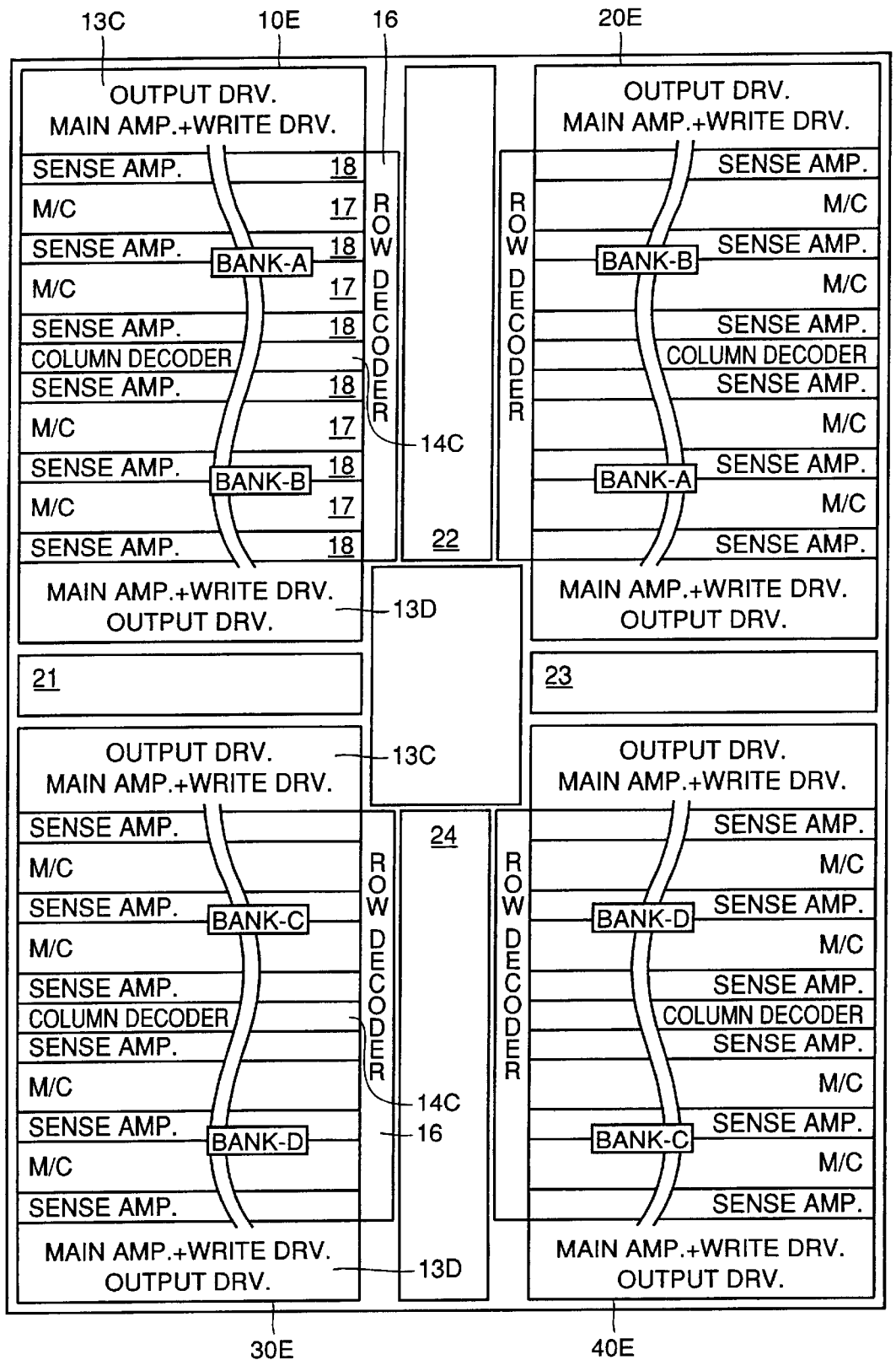
FIG. 12 is a schematic block diagram of a semiconductor memory device according to a sixth embodiment of the present invention.
Figure 13:
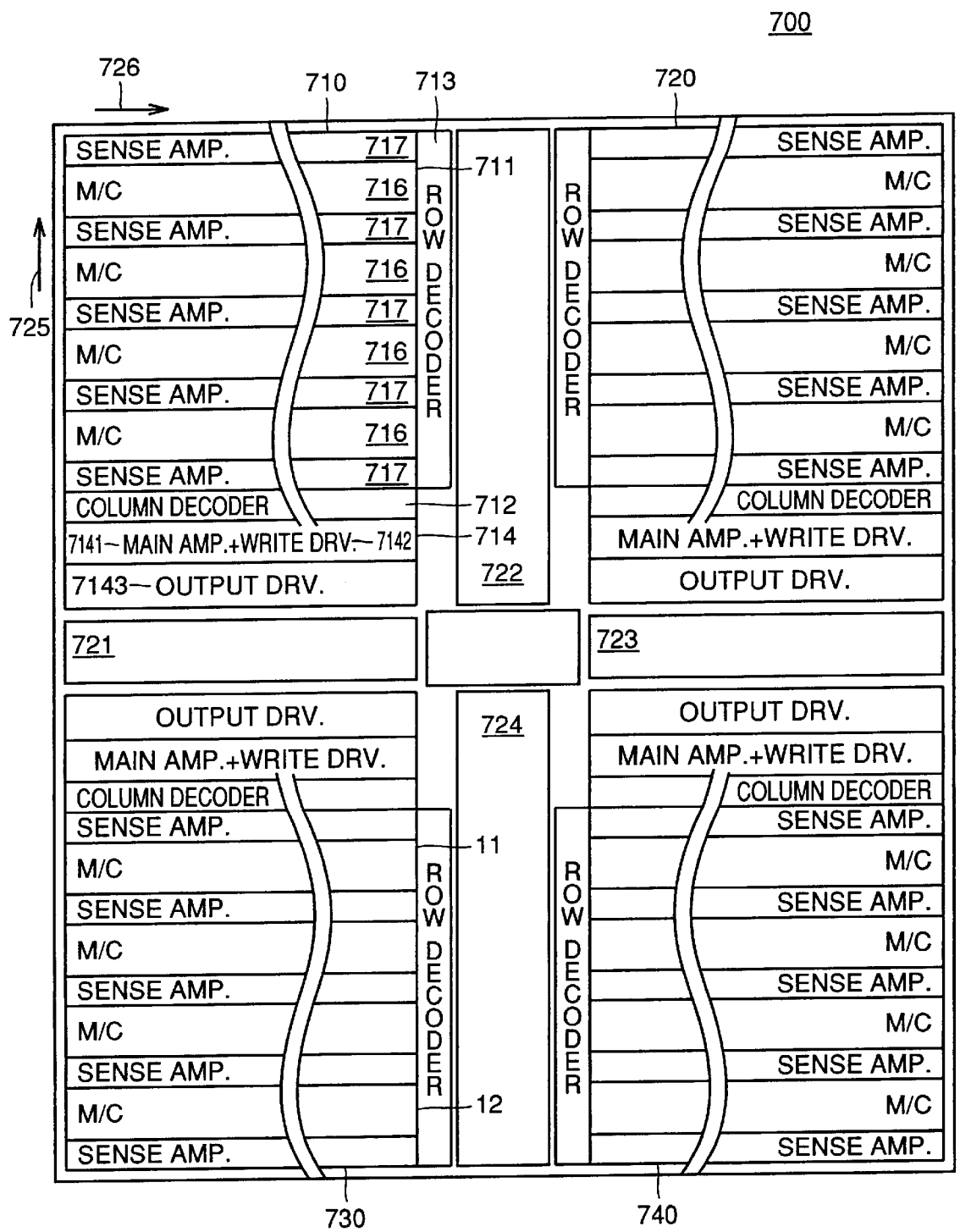
FIG. 13 is a schematic block diagram of a prior art semiconductor memory device.
Figure 14:
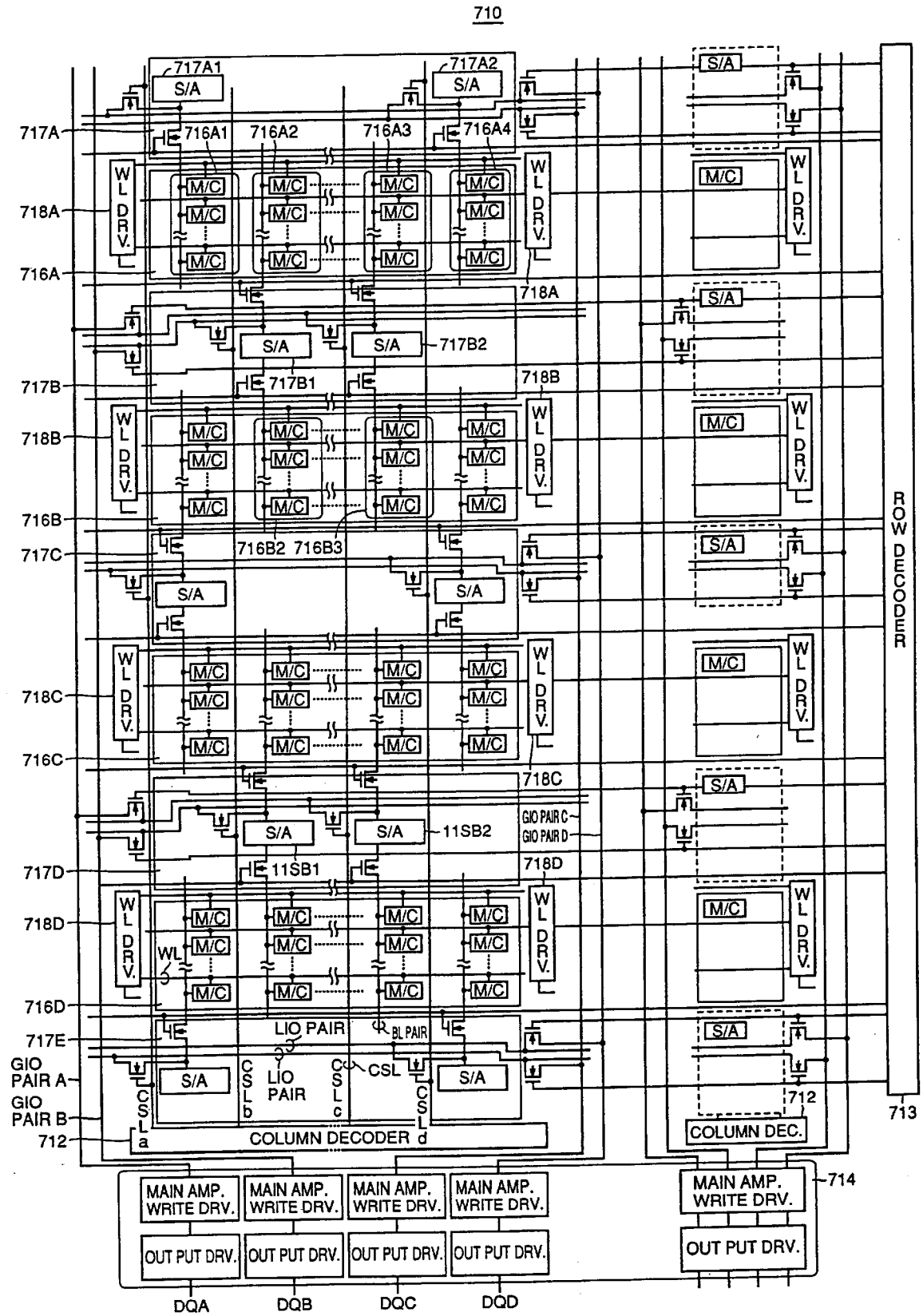
FIG. 14 is a circuit diagram of part of the circuit diagram shown in FIG. 13.

Referring to FIG. 12, a semiconductor memory device 600 according to the sixth embodiment has a configuration in which only the regions 10C, 20C, 30C and 40C of the semiconductor memory device 400 are replaced with the respective regions 10E, 20E, 30E and 40E, while the other part being the same as the semiconductor memory device 400.

In the semiconductor memory device 600, the regions 10E and 30E each include memory cell arrays 11 and 12, input/output circuit zones 13C and 13D, a column decoder 14C, and a row decoder 16. That is, the regions 10E and 30E are constructed of the same constituents as the respective regions 10C and 30C of the semiconductor memory device 400. What the region 10E is different from the region 10C is that each of the memory cells 11 and 12 constitutes one different bank. Furthermore, what the region 30E is different from the region 30C in is that each of the memory cells 11 and 12 constitutes one different bank. In the semiconductor memory device 600, the region 30E is constituted of two banks different from the two banks constituting the region 10E. Hence, in the region 10E, the memory cell array 11 constitutes a bank A and the memory cell array 12 constitutes a bank B. Furthermore, in the region 30E, the memory cell array 11 constitutes a bank C and the memory cell array 12 constitutes a bank D. The regions 20E is of the same configuration as the region 10E and the regions 40E is of the same configuration as the region 30E.

The other part of the configuration is the same as that of the fourth embodiment.

According to the sixth embodiment, since two input/output circuit zones are placed so as to sandwich the banks A and B therebetween and two input/output circuit zones are placed so as to sandwich the banks C and D therebetween, input/output circuit zones can be distributed in placement even in a semiconductor memory device of a 4 bank configuration. As a result, local concentration of power consumption can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of regions, each of which includes:

first and second memory cell arrays arranged in a column direction; and an input/output circuit zone placed between said first and second memory cell arrays, wherein each of said first and second memory cell arrays includes a plurality of memory cells and a sense amplifier group amplifying data output from said plurality of memory cells, said input/output circuit zone inputs or outputs data to or from said plurality of memory cells included in each of said first and second memory cell arrays and has at least one of a main amplifier, a write driver, said main amplifier further amplifying data amplified by said sense amplifier group in each of said first and second memory cell arrays, and said write driver writes data to said plurality of memory cells in each of said first and second memory cell arrays.

2. The semiconductor memory device according to claim 1, wherein one bank is composed of said first and second memory cell arrays.

3. The semiconductor memory device according to claim 1, wherein each of said first and second memory cell arrays constitutes one bank different from the other.

4. The semiconductor memory device according to claim 1, wherein said plurality of regions constitute a semiconductor memory device of a 4 bank configuration and each of said first and second memory cell arrays constitutes one bank different from the other.

5. The semiconductor memory device according to claim 1, wherein data of n bits (n is a natural number) is inputted or outputted to or from each of said plurality of regions and said input/output circuit zone includes n input/output circuits for inputting or outputting data of n bits to or from a plurality of memory cells included in said first or second memory cell arrays.

6. A semiconductor memory device having a plurality of regions, each of which includes:

first and second memory cell arrays arranged in a column direction;

an input/output circuit zone placed between said first and second memory cell arrays, wherein said input/output circuit zone inputs or outputs data to or from a plurality of memory cells included in each of said first and second memory cell arrays;

a plurality of first local input/output line pairs inputting or outputting data to or from each of a plurality of memory cells included in said first memory cell array;

a plurality of second local input/output line pairs inputting or outputting data to or from each of a plurality of memory cells included in said second memory cell array;

a plurality of common global input/output line pairs connected to said input/output circuit zone;

a plurality of first global input/output line pairs connected to said plurality of first local input/output line pairs;

a plurality of second global input/output line pairs connected to said plurality of second local input/output line pairs;

a plurality of first switches connecting said plurality of common global input/output line pairs to a corresponding plurality of first global input/output line pairs; and a plurality of second switches connecting said plurality of common global input/output line pairs to a corresponding plurality of second global input/output line pairs.

7. The semiconductor memory device according to claim 6, wherein said plurality of first switches and said plurality of second switches are placed between said first and second memory cell arrays.

8. The semiconductor memory device according to claim 6, wherein each of said plurality of regions further includes:

a first column decoder selecting a plurality of bit line pairs connected to said plurality of memory cells included in said first memory cell array; and a second column decoder selecting a plurality of bit line pairs connected to said plurality of memory cells included in said second memory cell array,
wherein each of said plurality of first switches is turned on/off by a control signal from said first column decoder and
each of said plurality of second switches is turned on/off by a control signal from said second column decoder.

9. The semiconductor memory device according to claim 6, wherein each of said plurality of regions further includes:

a first switch connecting a first global input/output line pair for inputting or outputting data to or from one memory cell selected arbitrarily from said first memory cell array with a common global input/output line pair corresponding to said first global input/output line pair;

a second switch connecting a second global input/output line pair for inputting or outputting data to or from a memory cell having the same address as said one memory cell among said plurality of memory cells included in said second memory cell array with a common global input/output line pair corresponding to said second global input/output line pair; wherein in a test mode,
said first switch is turned on, and
said second switch is turned on.

10. A semiconductor memory device having a plurality of regions, each of which includes:

first and second column decoders;

first and second memory cell arrays arranged in a column direction, each memory cell array associated with a different one of the first and second column decoders; and an input/output circuit zone placed between said first and second memory cell arrays, wherein said input/output circuit zone inputs or outputs data to or from a plurality of memory cells included in each of said first and second memory cell arrays.

* * * * *